(12) United States Patent
Sakata et al.

(10) Patent No.: US 10,957,828 B2
(45) Date of Patent: Mar. 23, 2021

(54) LIGHT SOURCE APPARATUS AND PROJECTOR

(71) Applicant: SEIKO EPSON CORPORATION, Tokyo (JP)

(72) Inventors: Hidefumi Sakata, Kamiina-gun (JP); Junichi Suzuki, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/550,354

(22) Filed: Aug. 26, 2019

(65) Prior Publication Data

US 2020/0066945 A1 Feb. 27, 2020

(30) Foreign Application Priority Data

Aug. 27, 2018 (JP) .............................. JP2018-158364
Dec. 10, 2018 (JP) .............................. JP2018-230916

(51) Int. Cl.
*H01L 33/50* (2010.01)
*H01L 27/15* (2006.01)
(Continued)

(52) U.S. Cl.
CPC .......... *H01L 33/505* (2013.01); *G02B 6/0003* (2013.01); *G02B 6/0068* (2013.01); *H01L 27/153* (2013.01); *H01L 33/60* (2013.01)

(58) Field of Classification Search
CPC ..... H01L 33/505; H01L 33/60; H01L 27/153; G02B 6/0003; G02B 6/0068
(Continued)

(56) References Cited

U.S. PATENT DOCUMENTS

2005/0173719 A1* 8/2005 Yonekubo ............ G02B 6/4201
257/98
2009/0078949 A1 3/2009 Bechtel et al.
(Continued)

FOREIGN PATENT DOCUMENTS

EP 2 998 790 A1 3/2016
JP 2016-531381 A 10/2016
(Continued)

OTHER PUBLICATIONS

Jan. 28, 2020 extended Search Report issued in European Patent Application No. 19193327.4.

*Primary Examiner* — Tong-Ho Kim
(74) *Attorney, Agent, or Firm* — Oliff PLC

(57) ABSTRACT

A light source apparatus includes a light source that outputs excitation light, a first wavelength converter containing a first phosphor and converts excitation light into first fluorescence having a first wavelength band, a second wavelength converter containing a second phosphor and converts excitation light into second fluorescence having a second wavelength band, a reflector reflecting second fluorescence guided in second wavelength converter, and a light guide guiding second fluorescence having exited out of second wavelength converter to first wavelength converter. A first side surface of first wavelength converter faces second side surface of second wavelength converter. The reflector is provided at the second wavelength converter's fourth end surface. The light guide has a reflection surface that faces the third end surface of the second wavelength converter and second end surface of the first wavelength converter. The first and second fluorescence exit via the first end surface of first wavelength converter.

18 Claims, 9 Drawing Sheets

(51) Int. Cl.
 *H01L 33/60* (2010.01)
 *F21V 8/00* (2006.01)
(58) Field of Classification Search
 USPC .......................................................... 257/89
 See application file for complete search history.

(56) References Cited

U.S. PATENT DOCUMENTS

2016/0084452 A1\* 3/2016 Hikmet ................ G03B 21/204
 362/19
2016/0131813 A1 5/2016 Hikmet et al.
2016/0266297 A1 9/2016 Hikmet et al.
2018/0106460 A1\* 4/2018 Van Bommel ............ F21V 9/08

FOREIGN PATENT DOCUMENTS

| JP | 2016-537770 A | 12/2016 |
| JP | 2017-138376 A | 8/2017 |
| JP | 2017-535031 A | 11/2017 |
| WO | 2006/054203 A1 | 5/2006 |
| WO | 2008/042703 A1 | 4/2008 |
| WO | 2014/198619 A1 | 12/2014 |
| WO | 2015/058979 A1 | 4/2015 |
| WO | 2016/045957 A1 | 3/2016 |
| WO | 2016/162233 A1 | 10/2016 |

\* cited by examiner

LIGHT SOURCE APPARATUS AND PROJECTOR

The present application is based on, and claims priority from JP Application Serial Numbers 2018-158364, filed Aug. 27, 2018, and 2018-230916, filed Dec. 10, 2018, the disclosure of which is hereby incorporated by reference herein in its entirety.

BACKGROUND

1. Technical Field

The present disclosure relates to a light source apparatus and a projector.

2. Related Art

As a light source apparatus used in a projector, there is a proposed light source apparatus using fluorescence emitted from a phosphor irradiated with excitation light outputted from a light emitter. WO 2006/054203 discloses a light source apparatus including a plate-shaped wavelength conversion member containing a phosphor and a light emitting diode (LED) that outputs excitation light and having a configuration in which the excitation light enters the wavelength conversion member via a large-area surface out of a plurality of surfaces thereof and the resultant converted light exits out of the wavelength conversion member via a small-area surface.

As described in WO 2006/054203, causing the excitation light from the LED to enter the wavelength conversion member allows generation of light having a wavelength different from the wavelength of the light outputted from the LED. For example, in a case where the wavelength conversion member contains a yellow phosphor, blue excitation light outputted from the LED can generate yellow light. To allow the configuration described above to generate bright light, it is necessary, for example, to increase the power of the excitation light source or increase the number of excitation light sources along with an increase in the size of the wavelength conversion member. Increasing the power of the excitation light source, however, causes a problem of an increase in the amount of heat generated from the excitation light source, resulting in an increase in the size of the light source apparatus including a cooling system. Further, increasing the number of excitation light sources causes a problem of a decrease in the ratio of the light that enters the wavelength conversion member to the entire light outputted from the excitation light sources.

SUMMARY

A light source apparatus according to an aspect of the present disclosure includes a light source that outputs excitation light, a first wavelength converter that contains a first phosphor and converts the excitation light into first fluorescence having a first wavelength band different from a wavelength band of the excitation light, a second wavelength converter that contains a second phosphor and converts the excitation light into second fluorescence having a second wavelength band different from the wavelength band of the excitation light, and a light guide that guides the second fluorescence having exited out of the second wavelength converter to the first wavelength converter. The first wavelength converter has a first end surface and a second end surface that face each other and a first side surface that intersects the first and second end surfaces. The second wavelength converter has a third end surface and a fourth end surface that face each other and a second side surface that intersects the third and fourth end surfaces. The first side surface of the first wavelength converter faces the second side surface of the second wavelength converter. The light guide has a reflection surface that faces the third end surface of the second wavelength converter and the second end surface of the first wavelength converter. The first fluorescence and the second fluorescence exit via the first end surface of the first wavelength converter.

The light source apparatus according to the aspect of the present disclosure may further include a reflector that is provided at the fourth end surface of the second wavelength converter and reflects the second fluorescence guided in the second wavelength converter.

In the light source apparatus according to the aspect of the present disclosure, the reflection surface of the light guide may have a first reflection surface facing the third end surface of the second wavelength converter and a second reflection surface facing the second end surface of the first wavelength converter, and the second fluorescence generated in the second wavelength converter may exit via the third end surface, be reflected off the first reflection surface, be reflected off the second reflection surface, enter the first wavelength converter via the second end surface, and exit via the first end surface.

In the light source apparatus according to the aspect of the present disclosure, the light guide may include a first prism having the first reflection surface, a second prism having the second reflection surface, and a glass block provided between the first prism and the second prism.

The light source apparatus according to the aspect of the present disclosure may further include a third wavelength converter that contains a third phosphor and outputs third fluorescence having a third wavelength band different from the first and second wavelength bands. The third wavelength converter may have a fifth end surface and a sixth end surface that face each other and a fifth side surface that intersects the fifth and sixth end surfaces. The first side surface of the first wavelength converter may face the fifth side surface of the third wavelength converter. The second side surface of the second wavelength converter may face the fifth side surface of the third wavelength converter. The light guide may include a first light guide having the first reflection surface and a third reflection surface that faces the sixth end surface of the third wavelength converter, and a second light guide having the second reflection surface and a fourth reflection surface that faces the fifth end surface of the third wavelength converter.

In the light source apparatus according to the aspect of the present disclosure, the light source may include a first light emitter that outputs first excitation light and a second light emitter that outputs second excitation light.

In the light source apparatus according to the aspect of the present disclosure, the first wavelength converter may have a third side surface that intersects the first and second end surfaces. The second wavelength converter may have a fourth side surface that intersects the third and fourth end surfaces. The first excitation light may enter the first wavelength converter via the third side surface of the first wavelength converter. The second excitation light may enter the second wavelength converter via the fourth side surface of the second wavelength converter.

In the light source apparatus according to the aspect of the present disclosure, the light source may include a light emitting diode that is so provided as to face the third side surface of the first wavelength converter and the fourth side surface of the second wavelength converter and outputs the first excitation light and the second excitation light.

In the light source apparatus according to the aspect of the present disclosure, the first excitation light and the second excitation light may differ from each other in terms of wavelength band.

In the light source apparatus according to the aspect of the present disclosure, the first wavelength band may be equal to the second wavelength band.

In the light source apparatus according to the aspect of the present disclosure, the first wavelength band may differ from the second wavelength band.

In the light source apparatus according to the aspect of the present disclosure, the first wavelength band may be a blue wavelength band, and the second wavelength band may be a yellow wavelength band.

In the light source apparatus according to the aspect of the present disclosure, the first wavelength band may be a green wavelength band, and the second wavelength band may be a red wavelength band.

In the light source apparatus according to the aspect of the present disclosure, the first wavelength band may be a blue wavelength band, the second wavelength band may be a red wavelength band, and the third wavelength band may be a green wavelength band.

The light source apparatus according to the aspect of the present disclosure may further include an angle converter that is provided at a light exiting side of the first wavelength converter, has a light incident end surface and a light exiting end surface, and causes a diffusion angle of the combined fluorescence at the light exiting end surface to be smaller than the diffusion angle of the combined fluorescence at the light incident end surface.

A projector according to another aspect of the present disclosure includes the light source apparatus according to the aspect of the present disclosure, a light modulator that modulates light from the light source apparatus in accordance with image information, and a projection optical apparatus that projects the light modulated by the light modulator.

DESCRIPTION OF EXEMPLARY EMBODIMENTS

First Embodiment

A first embodiment of the present disclosure will be described below with reference to FIGS. 1 to 3.

A projector according to the present embodiment is an example of a projector using a liquid crystal panel as a light modulator.

In the following drawings, components are drawn at different dimensional scales in some cases for clarity of each of the components.

Figure 1:
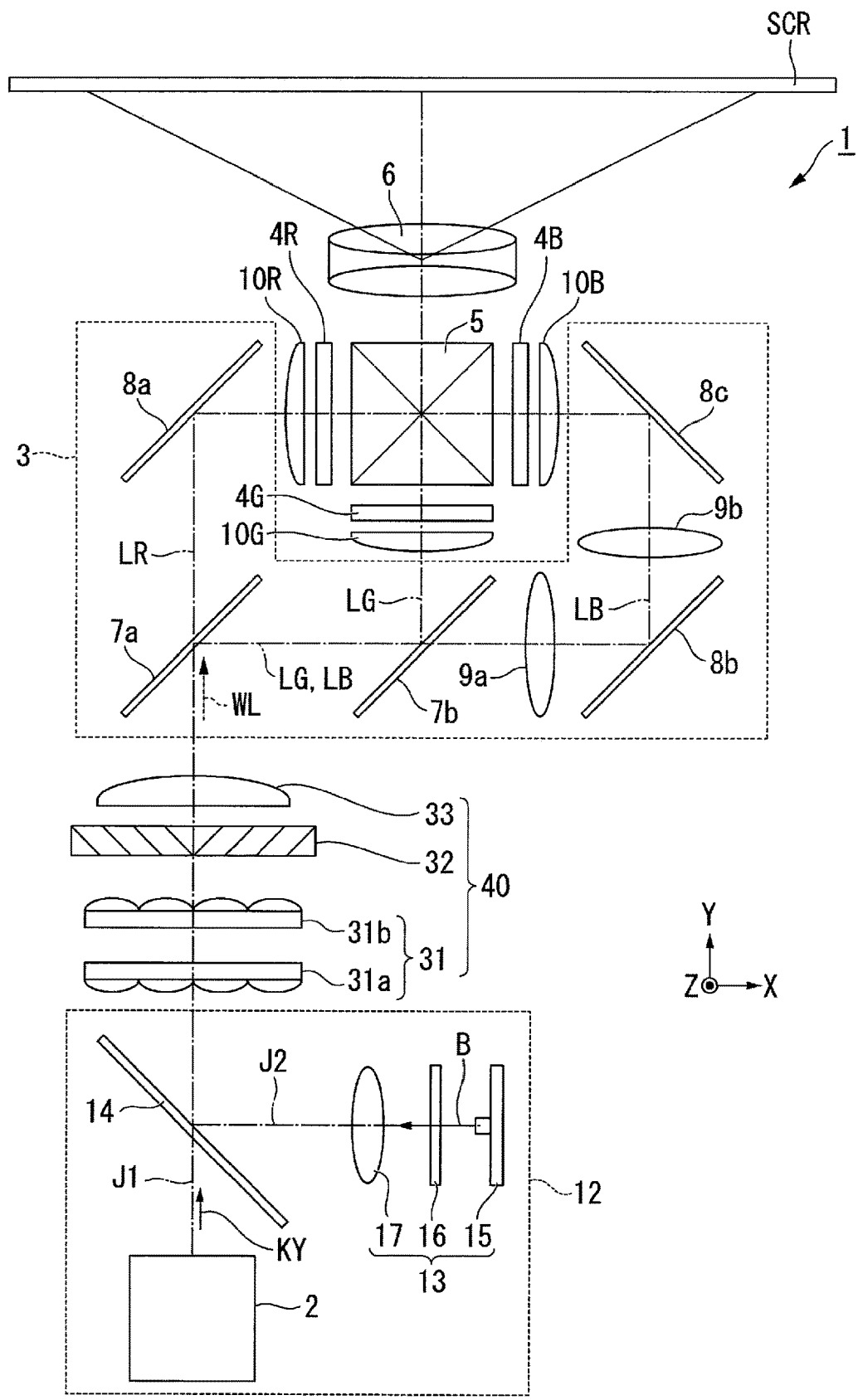
FIG. 1 is a schematic configuration diagram of a projector according to a first embodiment.

FIG. 1 is a schematic configuration diagram of a projector 1 according to the first embodiment.

The projector 1 according to the first embodiment is a projection-type image display apparatus that projects a color image on a screen (projection surface) SCR. The projector 1 uses three light modulators corresponding to the following color light: red light LR; green light LG; and blue light LB.

The projector 1 includes an illuminator 12, a uniform illumination system 40, a color separation system 3, a light modulator 4R, a light modulator 4G, and a light modulator 4B, a light combining system 5, and a projection optical apparatus 6, as shown in FIG. 1.

The illuminator 12 outputs white illumination light WL toward the uniform illumination system 40. The detailed configuration of the illuminator 12 will be described later in detail.

The uniform illumination system 40 includes an optical integration system 31, a polarization converter 32, and a superimposing system 33. The optical integration system 31 includes a first lens array 31a and a second lens array 31b. The uniform illumination system 40 homogenizes the intensity distribution of the illumination light WL, which is outputted from the light source apparatus 2, in each of the light modulators 4R, 4G, and 4B, which are each a region to be illuminated. The illumination light WL having exited out of the uniform illumination system 40 enters the color separation system 3.

The color separation system 3 separates the white illumination light WL into the red light LR, the green light LG, and the blue light LB. The color separation system 3 includes a first dichroic mirror 7a, a second dichroic mirror 7b, a first reflection mirror 8a, a second reflection mirror 8b, a third reflection mirror 8c, a first relay lens 9a and a second relay lens 9b.

The first dichroic mirror 7a separates the illumination light WL from the illuminator 12 into the red light LR and the other light (green light LG and blue light LB). The first dichroic mirror 7a transmits the separated red light LR and reflects the other light (green light LG and blue light LB). On the other hand, the second dichroic mirror 7b separates the other light into the green light LG and the blue light LB. The second dichroic mirror 7b reflects the separated green light LG and transmits the blue light LB.

The first reflection mirror 8a is disposed in the optical path of the red light LR and reflects the red light LR having passed through the first dichroic mirror 7a toward the light modulator 4R. On the other hand, the second reflection mirror 8b and the third reflection mirror 8c are disposed in the optical path of the blue light LB and reflect the blue light LB having passed through the second dichroic mirror 7b toward the light modulator 4B. The green light LG is reflected off the second dichroic mirror 7b toward the light modulator 4G.

The first relay lens 9a and the second relay lens 9b are disposed in the optical path of the blue light LB on the light exiting side of the second dichroic mirror 7b. The first relay lens 9a and the second relay lens 9b correct the difference in illumination distribution of the blue light LB resulting from the fact that the optical path of the blue light LB is longer than the optical paths of the red light LR and the green light LG.

The light modulator 4R modulates the red light LR in accordance with image information to form image light corresponding to the red light LR. The light modulator 4G modulates the green light LG in accordance with image information to form image light corresponding to the green light LG. The light modulator 4B modulates the blue light LB in accordance with image information to form image light corresponding to the blue light LB.

The light modulators 4R, 4G, and 4B are each formed, for example, of a transmissive liquid crystal panel. Polarizers (not shown) are disposed on the light incident side and the light exiting side of each of the liquid crystal panels and each transmit only light linearly polarized in a specific direction.

Field lenses 10R, 10G, and 10G are disposed on the light incident side of the light modulators 4R, 4G, and 4B, respectively. The field lenses 10R, 10G, and 10B parallelize the chief rays of the red light LR, the green light LG, and the blue light LB to be incident on the light modulators 4R, 4G, and 4B, respectively.

The light combining system 5 receives the incident image light outputted from each of the light modulators 4R, 4G, and 4B, combines the image light corresponding to the red light LR, the image light corresponding to the green light LG, and the image light corresponding to the blue light LB with one another, and causes the combined image light to exit toward the projection optical apparatus 6. The light combining system 5 is formed, for example, of a cross dichroic prism.

The projection optical apparatus 6 is formed of a plurality of projection lenses. The projection optical apparatus 6 enlarges the combined image light from the light combining systems 5 and projects the enlarged image light toward the screen SCR. An image is thus displayed on the screen SCR.

The illuminator 12 will be described below.

The illuminator 12 includes a light source apparatus 2, a blue light source section 13, and a light combiner 14.

Figure 2:
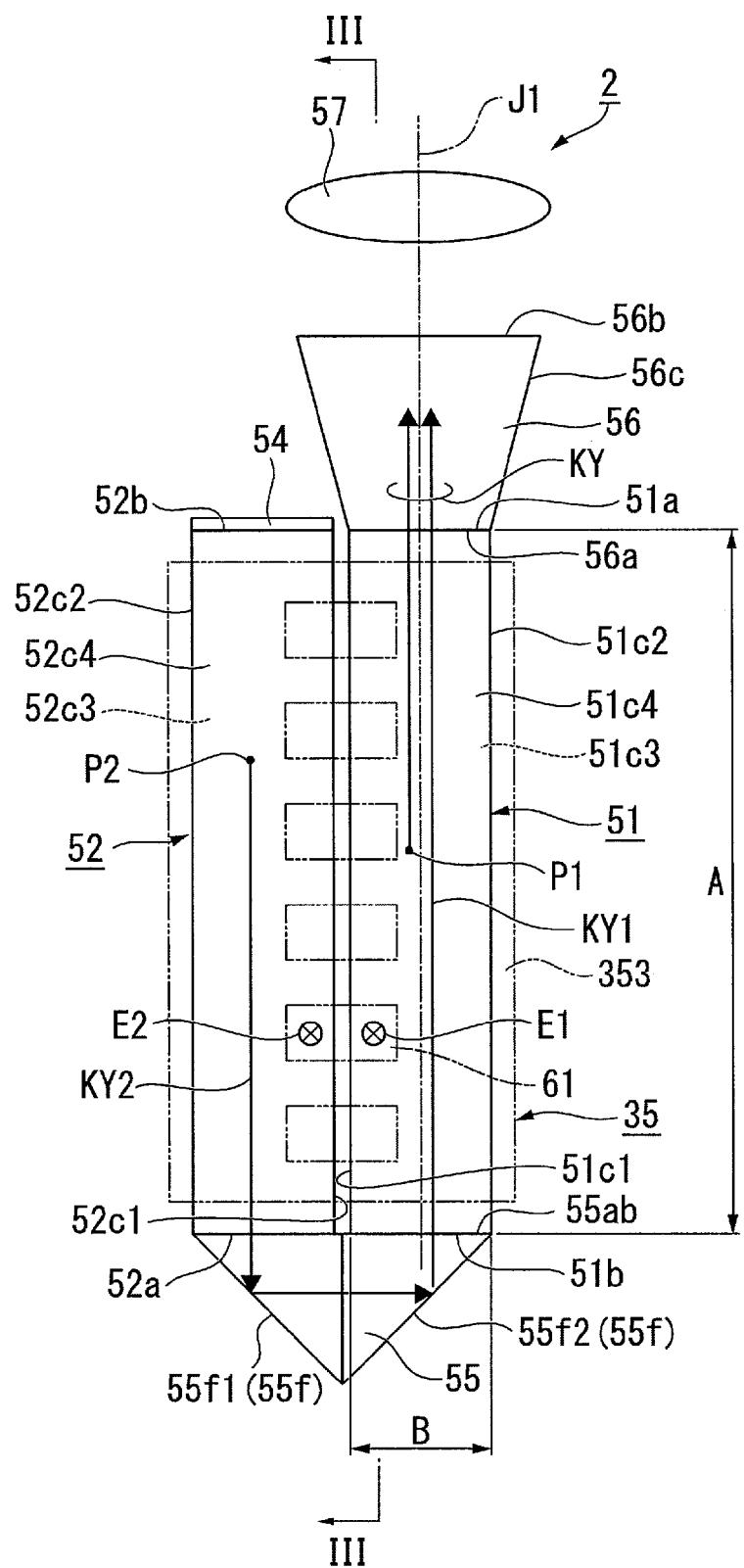
FIG. 2 is a schematic configuration diagram of a light source apparatus according to the first embodiment.

FIG. 2 is a schematic configuration diagram of the light source apparatus 2.

Figure 3:
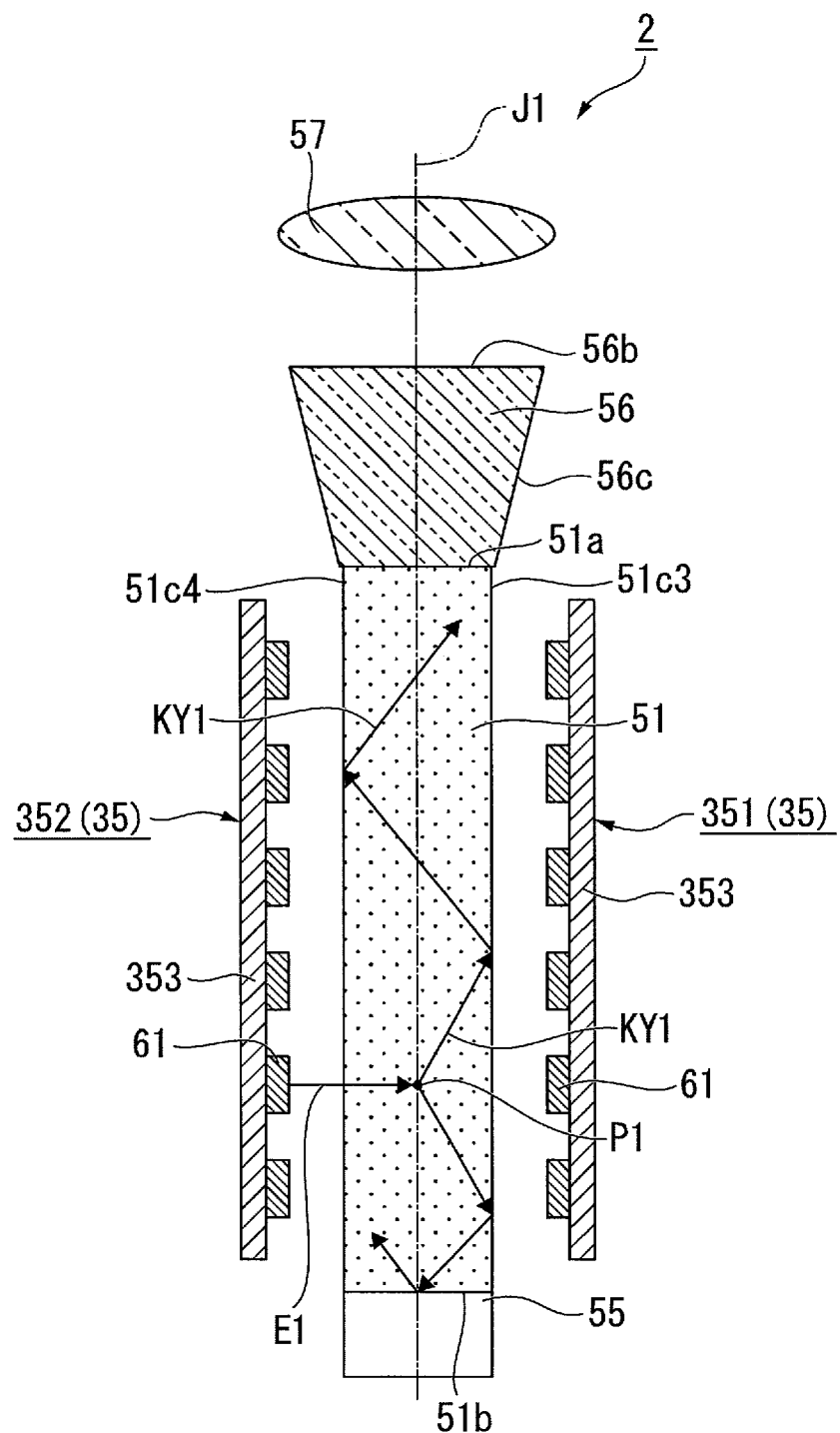
FIG. 3 is a cross-sectional view of the light source apparatus taken along the line in FIG. 2.

FIG. 3 is a cross-sectional view of the light source apparatus taken along the line III-III in FIG. 2.

The light source apparatus 2 includes a first wavelength conversion rod 51 (first wavelength converter), a second wavelength conversion rod 52 (second wavelength converter), a light source 35, a mirror 54 (reflector), a prism mirror 55 (light guide), an angle converter 56, and a collimator lens 57, as shown in FIGS. 2 and 3.

The first wavelength conversion rod 51 has a quadrangular columnar shape and has a first end surface 51a and a second end surface 51b, which face each other, and four side surfaces 51c1, 51c2, 51c3, and 51c4, which interest the first end surface 51a and the second end surface 51b. The four side surfaces 51c1, 51c2, 51c3, and 51c4 as a whole correspond to the first side surface in the appended claims. Fluorescence KY exits out of the first wavelength conversion rod 51 via the first end surface 51a. An axis passing through the center of the first end surface 51a and the center of the second end surface 51b of the first wavelength conversion rod 51 is defined as an optical axis J1 of the light source apparatus 2. The fluorescence KY generated in the light source apparatus 2 exits via the first end surface 51a along the optical axis J1.

The second wavelength conversion rod 52 has a quadrangular columnar shape and has a third end surface 52a and a fourth end surface 52b, which face each other, and four side surfaces 52c1, 52c2, 52c3, and 52c4, which interest the third end surface 52a and the fourth end surface 52b. The four side surfaces 52c1, 52c2, 52c3, and 52c4 as a whole correspond to the second side surface in the appended claims. Second fluorescence KY2 exits out of the second wavelength conversion rod 52 via the third end surface 52a.

In the present embodiment, the first wavelength conversion rod 51 and the second wavelength conversion rod 52 have substantially the same dimension. The dimension A of the first wavelength conversion rod 51 in the longitudinal direction thereof (direction of normal to first end surface 50a) is greater than the dimension B of the first wavelength conversion rod 51 in the width direction thereof (direction of normal to side surfaces 51c2). For example, the dimension A is greater than the dimension B by a factor of about ten to several dozens. The second wavelength conversion rod 52 is configured in the same manner as is the first wavelength conversion rod 51.

The wavelength conversion rods 51 and 52 each do not necessarily have a quadrangular columnar shape and may have a triangular columnar shape or any other polygonal columnar shape. The wavelength conversion rods 51 and 52 may each still instead have a cylindrical shape. In the case where the wavelength conversion rods 51 and 52 each have a cylindrical shape, the wavelength conversion rods 51 and 52 each have two circular end surfaces that face each other and one cylindrical side surface that interests the two end surfaces.

The first wavelength conversion rod 51 and the second wavelength conversion rod 52 are so disposed with a gap therebetween that the side surface 51c1 of the first wavelength conversion rod 51 faces the side surface 52c1 of the second wavelength conversion rod 52. The side surface 51c2 of the first wavelength conversion rod 51 faces away from the side surface 52c2 of the second wavelength conversion rod 52. That is, the two wavelength conversion rods 51 and 52 are disposed in parallel to each other.

The first end surface 51a (light exiting end surface) of the first wavelength conversion rod 51 and the fourth end surface 52b of the second wavelength conversion rod 52 are disposed at one-side ends of the wavelength conversion rods 51 and 52 in the longitudinal direction thereof. The second end surface 51b of the first wavelength conversion rod 51 and the third end surface 52a (light exiting end surface) of the second wavelength conversion rod 52 are disposed at the other-side ends of the wavelength conversion rods 51 and 52 in the longitudinal direction thereof.

The light source 35 includes a first light source 351 and a second light source 352, as shown in FIG. 3. The first light source 351 is provided in a position where the first light source 351 faces the side surface 51c3 of the first wavelength conversion rod 51 and the side surface 52c3 of the second wavelength conversion rod 52. The second light source 352 is provided in a position where the second light source 352 faces the side surface 51c4 of the first wavelength conversion rod 51 and the side surface 52c4 of the second wavelength conversion rod 52. The light source 35 outputs first excitation light E1 and second excitation light E2. Out of the four side surfaces of the first wavelength conversion rod 51, the side surfaces 51c3 and 51c4, which face the first light source 351 and the second light source 352, respectively, and on which the first excitation light is incident, correspond to the third side surface in the appended claims. Out of the four side surfaces of the second wavelength conversion rod 52, the side surfaces 52c3 and 52c4, which face the first light source 351 and the second light source 352, respectively, and on which the second excitation light is incident, correspond to the fourth side surface in the appended claims.

The first light source 351 and the second light source 352 have the same configuration and each include a substrate 353 and a plurality of light emitting diodes 61 (LEDs) mounted on one surface of the substrate 353 that is the surface facing the wavelength conversion rods 51 and 52. In the present embodiment, the light sources 351 and 352 each include six LEDs 61, but the number of LEDs 61 is not limited to a specific number. The LEDs 61 each output the first excitation light E1 and the second excitation light E2. The wavelength band of the first excitation light E1 and the second excitation light E2 is, for example, an ultraviolet wavelength band ranging from 200 to 380 nm. The wavelength band of the two types of excitation light may, however, instead be, for example, a violet wavelength band somewhere around 400 nm or a blue wavelength band. The light sources 351 and 352 may each include a light guide, a diffuser, a lens, and other optical members as well as the substrate 353 and the LEDs 61.

The plurality of LEDs 61 are provided in positions where the LEDs 61 face both the first wavelength conversion rod 51 and the second wavelength conversion rod 52. That is, the LEDs 61 are each so disposed as to face the first wavelength conversion rod 51 and the second wavelength conversion rod 52 and each serve as a light source for exciting the first wavelength conversion rod 51 and a light source for exciting the second wavelength conversion rod 52. The excitation light that enters the first wavelength conversion rod 51 and the excitation light that enters the second wavelength conversion rod 52 have the same wavelength band. Out of the excitation light outputted from the LEDs 61, the excitation light that enters the first wavelength conversion rod 51 corresponds to the first excitation light, and the excitation light that enters the second wavelength conversion rod 52 corresponds to the second excitation light. The first excitation light E1 enters the first wavelength conversion rod 51 via the side surfaces 51c3 and 51c4, and the second excitation light E2 enters the second wavelength conversion rod 52 via the side surfaces 52c3 and 52c4.

The light source 35 may instead separately include LEDs provided in positions where the LEDs face the first wavelength conversion rod 51 and LEDs provided in positions where the LEDs face the second wavelength conversion rod 52. In this case, the wavelength band of the first excitation light that enters the first wavelength conversion rod 51 may differ from the wavelength band of the second excitation light that enters the second wavelength conversion rod 52.

The first wavelength conversion rod 51 contains a ceramic phosphor (first phosphor) that converts in terms of wavelength the first excitation light E1 into first fluorescence KY1 having a first wavelength band. The first wavelength band is, for example, a yellow wavelength band ranging from 490 to 750 nm. The first fluorescence KY1 exits via the first end surface 51a of the first wavelength conversion rod 51.

The second wavelength conversion rod 52 contains a ceramic phosphor (second phosphor) that converts in terms of wavelength the second excitation light E2 into the second fluorescence KY2 having a second wavelength band. The second wavelength band is, for example, the yellow wavelength band ranging from 490 to 750 nm. The second fluorescence KY2 exits via the third end surface 52a of the second wavelength conversion rod 52. Therefore, the first fluorescence KY1 and the second fluorescence KY2 are each yellow light and have the same color.

The wavelength conversion rods 51 and 52 may be formed of a single-crystal phosphor in place of a ceramic phosphor (polycrystal phosphor). The wavelength conversion rods 51 and 52 may instead be made of fluorescent glass. Still instead, the wavelength conversion rods 51 and 52 may be made of a glass or resin binder in which a large number of phosphor particles are dispersed.

The wavelength conversion rods 51 and 52 each contain, for example, an yttrium-aluminum-garnet-based (YAG-based) phosphor as the yellow phosphor. Consider YAG:Ce, which contains cerium (Ce) as an activator, by way of example, and the yellow phosphor can be made, for example, of a material produced by mixing raw material powder containing $Y_2O_3$, $Al_2O_3$, $CeO_3$, and other constituent elements with one another and causing the mixture to undergo a solid-phase reaction, Y—Al—O amorphous particles produced by using a coprecipitation method, a sol-gel method, or any other wet method, or YAG particles produced by using a spray-drying method, a flame-based thermal decomposition method, a thermal plasma method, or any other gas-phase method. The wavelength conversion rods 51 and 52 each desirably contain the same type of phosphor but may contain phosphors different from each other.

The mirror 54 is provided on the fourth end surface 52b of the second wavelength conversion rod 52. The mirror 54 reflects the second fluorescence KY2 guided in the second wavelength conversion rod 52. The mirror 54 is formed of a metal film or a dielectric multilayer film provided on the fourth end surface 52b of the second wavelength conversion rod 52.

The prism mirror 55 has a reflection surface 55f, which is so provided as to face the third end surface 52a of the second wavelength conversion rod 52 and the second end surface 51b of the first wavelength conversion rod 51. The prism mirror 55 is formed of a triangular columnar prism having a right-angled isosceles triangular cross section. The prism mirror 55 has a light incident/exiting end surface 55ab, a first reflection surface 55f1, and a second reflection surface 55f2. That is, the reflection surface 55f is formed of the first reflection surface 55f1 and the second reflection surface 55f2. The first reflection surface 55f1 faces the third end surface 52a of the second wavelength conversion rod 52, and the second reflection surface 55f2 faces the second side surface 51b of the first wavelength conversion rod 51. The triangular columnar prism may be the combination of a first prism having the first reflection surface 55f1 and a second prism having the second reflection surface 55f2 bonded to each other or a unitary prism having the first reflection surface 55f1 and the second reflection surface 55f2.

The prism mirror 55 has the function of deflecting the optical path of the second fluorescence KY2 incident thereon by 180° and causing the second fluorescence KY2 to exit along the deflected optical path. That is, the prism mirror 55 causes the second fluorescence KY2 incident via the light incident/exiting end surface 55ab to be sequentially reflected off the two reflection surfaces 55f1 and 55f2 to deflect the optical axis of the second fluorescence KY2 by 180° and causes the second fluorescence KY2 to exit via the light incident/exiting end surface 55ab. The prism mirror 55 thus guides the second fluorescence KY2 having exited out of the second wavelength conversion rod 52 to the first wavelength conversion rod 51.

The angular converter 56 is provided on the first end surface 51a of the first wavelength conversion rod 51. The angle converter 56 is formed of a tapered rod having a light incident end surface 56a, on which the fluorescence KY containing the first fluorescence KY1 and the second fluorescence KY2 is incident, and a light exiting end surface 56b, via which the fluorescence KY exits. The angle converter 56 has a truncated pyramidal shape, with the cross-sectional area thereof perpendicular to the optical axis J1 increasing with distance along the traveling direction of the fluorescence KY, and the area of the light exiting end surface 56b is therefore greater than the area of the light incident end surface 56a. The thus shaped angle converter 56 angularly changes the traveling direction of the fluorescence KY, while the fluorescence KY travels in the angle converter 56, to the direction parallel to the optical axis J1 each time the fluorescence KY is totally reflected off a side surface 56c. The angle converter 56 thus causes the diffusion angle of the fluorescence KY at the light exiting end surface 56b to be smaller than the diffusion angle of the fluorescence KY at the light incident end surface 56a.

The angle converter 56 is so fixed to the first wavelength conversion rod 51 that the light incident end surface 56a faces the first end surface 51a of the first wavelength conversion rod 51. That is, the angle converter 56 and the first wavelength conversion rod 51 are in contact with each other via an optical adhesive (not shown), and no air gap (air layer) is provided between the angle converter 56 and the first wavelength conversion rod 51.

The angle converter 56 may instead be so fixed to the first wavelength conversion rod 51, for example, via an arbitrary support member that they are in direct contact with one another. In either case, it is desirable that no air gap is provided between the angle converter 56 and the first wavelength conversion rod 51. It is further desirable that the refractive index of the angle converter 56 is as close as possible to the refractive index of the first wavelength conversion rod 51.

The angle converter 56 may instead be a compound parabolic concentrator (CPC) in place of the tapered rod. In the case where the angle converter 56 is a CPC, the same effect provided in the case where the angle converter 56 is the tapered rod is provided.

The collimator lens 57 is provided at the light exiting side of the light exiting end surface 56b of the angle converter 56. The collimator lens 57 parallelizes the fluorescence KY having exited out of the angle converter 56. That is, the collimator lens 57 further increases the parallelism of the fluorescence KY, the angle distribution of which has been converted by the angle converter 56. The collimator lens 57 is formed of a convex lens. In a case where only the angle converter 56 provides sufficient parallelism of the fluorescence KY, the collimator lens 57 may not be provided.

The blue light source section 13 includes a semiconductor laser 15, a diffuser 16, and a light collection lens 17, as shown in FIG. 1. An axis perpendicular to the optical axis J1 of the light source apparatus 2 and passing through the center of the light combiner 14 is defined as an optical axis J2. The semiconductor laser 15, the diffuser 16, and the light collection lens 17 are disposed in the presented order along the optical axis J2 from the side away from the light combiner 14 toward the side close thereto.

The semiconductor laser 15 outputs blue light B having a predetermined wavelength band toward the diffuser 16. The wavelength band of the blue light ranges, for example, from 440 to 480 nm. The semiconductor laser may, for example, be formed of a plurality of semiconductor lasers arranged in an array.

The diffuser 16 is provided at the light exiting side of the semiconductor laser 15. The diffuser 16 diffuses the blue light B outputted from the semiconductor laser 15. The diffuser 16 is formed, for example, of a microlens array, a holographic diffuser, a ground glass plate having irregularities provided in the surface, or a fly-eye lens formed of two microlens arrays. The diffusion angle distribution of the blue light B after passing through the diffuser 16 is wider than the diffusion angle distribution of the blue light B before passing through the diffuser 16. The diffusion angle of the blue light B can thus be so spread as to be similar to the diffusion angle of the fluorescence KY. As a result, color unevenness of the illumination light WL resulting from the difference in the diffusion angle between the blue light B and the yellow fluorescence KY. Further, using the diffuser 16 allows suppression of speckle noise that is likely to occur when laser light is used.

The diffuser 16 may be rotatable around the axis of rotation that interests the plate surface of the diffuser 16. The speckle noise can thus be effectively suppressed.

The light collection lens 17 is provided at the light exiting side of the diffuser 16. The light collection lens 17 causes the blue light B having exited out of the diffuser 16 to converge toward the light combiner 14. The light collection lens 17 is formed of a convex lens.

The light combiner 14 is provided at the light exiting side of the light source apparatus 2 and the blue light source section 13. The light combiner 14 is formed of a dichroic mirror. The dichroic mirror transmits the yellow fluorescence KY outputted from the light source apparatus 2 and reflects the blue light B outputted from the blue light source section 13. The light combiner 14 thus produces the white illumination light WL, which is the combination of the yellow fluorescence KY and the blue light B.

The behavior of the light in the light source apparatus 2 according to the present embodiment will be described below.

When the second excitation light E2 outputted from the corresponding LEDs 61 enters the second wavelength conversion rod 52, the second excitation light E2 excites the second phosphor contained in the second wavelength conversion rod 52, and the second fluorescence KY2 is emitted from an arbitrary light emission point P2. The second fluorescence KY2 travels omnidirectionally from the arbitrary light emission point P2, and the second fluorescence KY2 traveling toward the side surfaces 52c1, 52c2, 52c3, and 52c4 travels toward the third end surface 52a or the fourth end surface 52b while being repeatedly totally reflected off the side surfaces 52c1, 52c2, 52c3, and 52c4. The second fluorescence KY2 traveling toward the third end surface 52a enters the prism mirror 55. On the other hand, the second fluorescence KY2 traveling toward the fourth end surface 52b is reflected off the mirror 54 and travels toward the third end surface 52a.

The second fluorescence KY2 having entered the prism mirror 55 is sequentially reflected off the first reflection surface 55f1 and the second reflection surface 55f2 of the prism mirror 55, so that the optical path of the second fluorescence KY2 is deflected back, and the second fluorescence KY2 enters the first wavelength conversion rod 51 via the second end surface 51b.

On the other hand, when the first excitation light E1 outputted from the corresponding LEDs 61 enters the first wavelength conversion rod 51, the first excitation light E1 excites the first phosphor contained in the first wavelength conversion rod 51, and the first fluorescence KY1 is emitted from an arbitrary light emission point P1. The first fluorescence KY1 travels omnidirectionally from the arbitrary light emission point P1, and the first fluorescence KY1 traveling toward the side surfaces 51c1, 51c2, 51c3, and 51c4 travels toward the first end surface 51a or the second end surface 51b while being repeatedly totally reflected off the side surfaces 51c1, 51c2, 51c3, and 51c4. The first fluorescence KY1 traveling toward the first end surface 51a enters the angular converter 56. The first fluorescence KY1 traveling toward the second end surface 51b traces back the path of the second fluorescence KY2, enters the second wavelength conversion rod 52, is then reflected off the mirror on the fourth end surface 52b, and enters the first wavelength conversion rod 51 again via the prism mirror 55.

The second fluorescence KY2 having entered the first wavelength conversion rod 51 is guided along with the first fluorescence KY1 through the first wavelength conversion rod 51, and the fluorescence KY formed of the first fluorescence KY1 and the second fluorescence KY2 exits via the first end surface 51a of the first wavelength conversion rod 51. That is, focusing on the fluorescence KY, the second fluorescence KY2 generated in the second wavelength conversion rod 52 exits via the third end surface 52a, is reflected off the first reflection surface 55f1, is reflected off the second reflection surface 55f2, enters the first wavelength conversion rod 51 via the second end surface 51b, and exits via the first end surface 51a. The fluorescence KY having exited out of the first wavelength conversion rod 51 is parallelized by the angular converter 56 and the collimator lens 57 and then outputted from the light source apparatus 2. The fluorescence KY (illumination light WL) outputted from the light source apparatus 2 travels toward the optical integration system 31, as shown in FIG. 1.

In the light source apparatus 2 according to the present embodiment, the first wavelength conversion rod 51, out of which the first fluorescence KY1 exits, and the second wavelength conversion rod 52, out of which the second fluorescence KY2 exits, are so disposed that the side surfaces 51c1 and 52c1 face each other. Further, the first light source 351 and the second light source 352 are provided in the positions where the two light sources face the side surfaces 51c3 and 51c4 of the first wavelength conversion rod 51 and the side surfaces 52c3 and 52c4 of the second wavelength conversion rod 52. A compact light source apparatus 2 can thus be achieved.

In the present embodiment, in particular, in which the two wavelength conversion rods 51 and 52, out of which the fluorescence KY1 and the fluorescence KY2 exit, are so disposed that side surfaces thereof face each other, the dimension of the light source apparatus 2 in the longitudinal direction can be substantially halved as compared with a case where the two wavelength conversion rods 51 and 52 are so disposed that end surfaces thereof face each other.

The light outputted from an LED typically has a diffusion angle greater than that of the light outputted from a semiconductor laser. A light source using an LED therefore tends to have etendue, which is determined by the product of the light emission area of the light source and the solid angle of the light from the light source, greater than the etendue of a light source using a semiconductor laser. An increase in the etendue of a light source apparatus increases the amount of light that an optical system on the downstream of the light source apparatus cannot capture, resulting in a decrease in the light use efficiency in a projector. It is therefore desirable that a light source apparatus for a projector has smallest possible etendue.

In view of the fact described above, in the light source apparatus 2 according to the present embodiment, the light outputted from the LEDs 61 and having a large diffusion angle enters the wavelength conversion rods 51 and 52 via the side surfaces thereof each having a large area. On the other hand, the fluorescence KY exits via the end surfaces of the wavelength conversion rods 51 and 52 each having an area sufficiently smaller than the area of each of the side surfaces thereof. Therefore, according to the present embodiment, the light emission area can be substantially reduced, whereby a light source apparatus 2 having small etendue can be achieved. As a result, use of the light source apparatus 2 in the project 1 allows an increase in the light use efficiency in an optical system on the downstream of the light source apparatus 2.

In the illuminator 12 in the present embodiment, the blue light source section 13 outputs the blue light B, the light source apparatus 2 outputs the yellow fluorescence KY, and the light combiner 14 combines the blue light B and the yellow fluorescence KY with each other into the white illumination light WL. Adjusting the balance between the amount of blue light B and the amount of yellow fluorescence KY can therefore adjust the white balance of the illumination light WL.

In the light source apparatus 2 according to the present embodiment, the LEDs 61 are each so disposed as to spread on the side surfaces 51c3 and 51c4 of the first wavelength conversion rod 51 and the side surfaces 52c3 and 52c4 of the second wavelength conversion rod 52 and therefore serve as a light source for exciting the first wavelength conversion rod and a light source for exciting the second wavelength conversion rod. The number of LEDs 61 can therefore be minimized, whereby the configuration of the light source 35 can be simplified.

In the light source apparatus 2 according to the present embodiment, the angle converter 56, which is provided at the light exiting side of the first wavelength conversion rod 51, can parallelize the fluorescence KY having exited out of the first wavelength conversion rod 51. Further, the collimator lens 57, which is provided at the light exiting side of the angle converter 56, can further increase the parallelism of the fluorescence KY. The light use efficiency in an optical system on the downstream of the light source apparatus 2 can thus be increased.

In the light source apparatus 2 according to the present embodiment, the mirror 54, which is provided on the fourth end surface 52b of the second wavelength conversion rod 52, can prevent the first fluorescence KY1 and the second fluorescence KY2 from exiting via the fourth end surface 52b. The efficiency at which the first fluorescence KY1 and the second fluorescence KY2 are used can thus be increased.

A reflection film formed, for example, of a metal film may be provided in place of the gap (air layer) between the side surface 51c1 of the first wavelength conversion rod 51 and the side surface 52c1 of the second wavelength conversion rod 52. It is, however, noted that optical loss is smaller at these side surfaces in the case where the air layer is provided between the first wavelength conversion rod 51 and the second wavelength conversion rod 52 than in the case where the reflection film is provided therebetween. Therefore, in a case where priority is plated on the suppression of optical loss, it is preferable to provide the air layer between the first wavelength conversion rod 51 and the second wavelength conversion rod 52.

That is, in the light source apparatus 2 according to the present embodiment, in which the side surface 51c1 of the first wavelength conversion rod 51 and the side surface 52c1 of the second wavelength conversion rod 52 face each other via the air layer, light reflection at the side surfaces 51c1 and 52c1 of the wavelength conversion rods 51 and 52 is total reflection accompanied by no optical loss. The light use efficiency can therefore be increased. Further, the side surfaces of the wavelength conversion rods 51 and 52 are each desirably polished into a smooth surface. The optical loss can thus be further suppressed.

The projector 1 according to the present embodiment, which includes the light source apparatus 2 described above, is reduced in size and excels in the light use efficiency.

Second Embodiment

A second embodiment of the present disclosure will be described below with reference to FIG. 4.

The basic configuration of a light source apparatus according to the second embodiment is the same as that according to the first embodiment, but the second embodiment differs from the first embodiment in that a third wavelength conversion rod is added. The overall configuration of the light source apparatus will not therefore be described.

Figure 4:
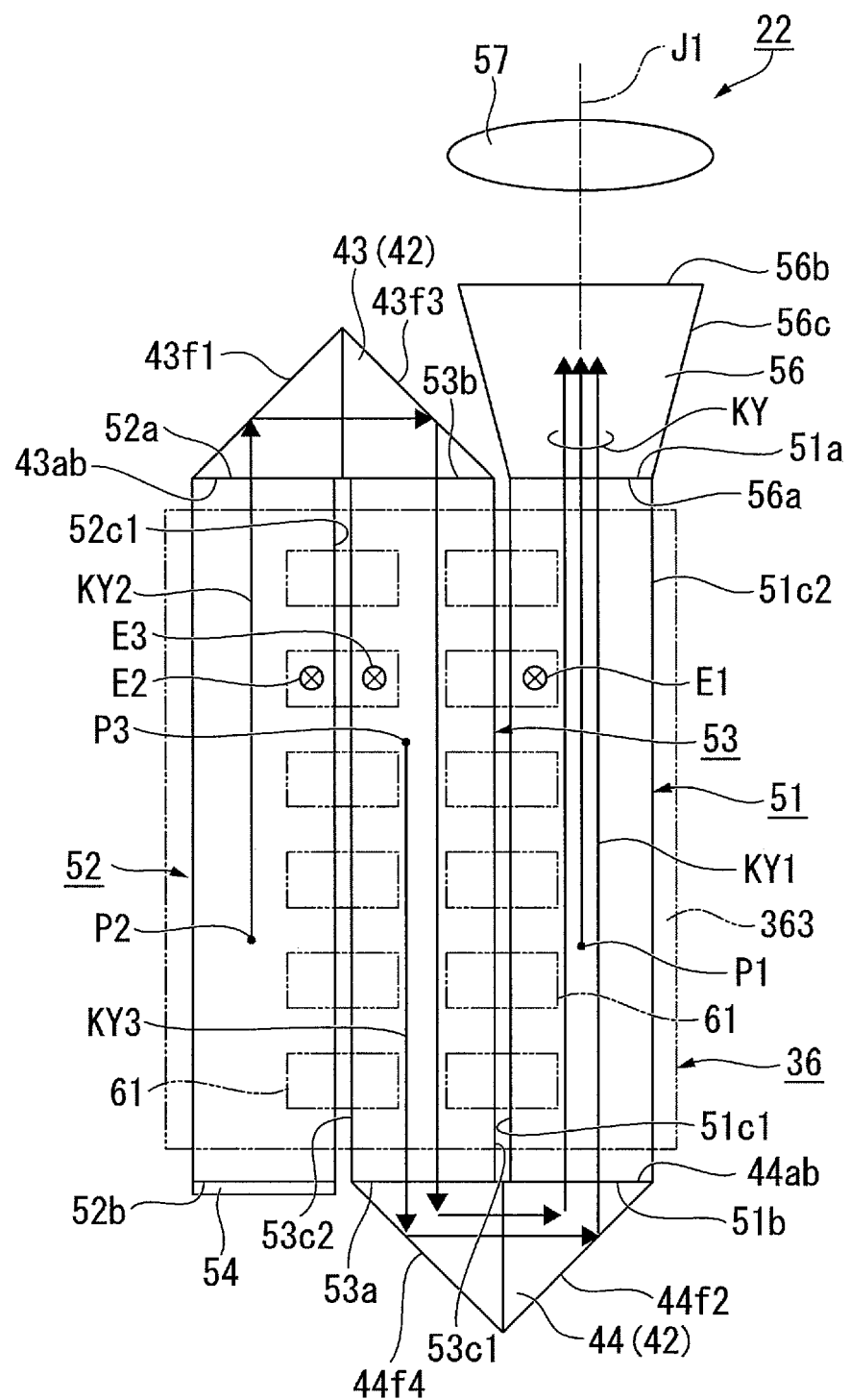
FIG. 4 is a schematic configuration diagram of a light source apparatus according to a second embodiment.

FIG. 4 is a schematic configuration diagram of a light source apparatus 22 according to the second embodiment.

In FIG. 4, components common to those in the first embodiment shown in FIG. 2 have the same reference characters and will not be described.

The light source apparatus 22 includes the first wavelength conversion rod 51 (first wavelength converter), the second wavelength conversion rod 52 (second wavelength converter), a third wavelength conversion rod 53 (third wavelength converter), a light source 36, the mirror 54 (reflector), the light guide 42, the angle converter 56, and the collimator lens 57, as shown in FIG. 4.

The third wavelength conversion rod 53 has a quadrangular columnar shape and has a fifth end surface 53a and a sixth end surface 53b, which face each other, and four side surfaces that interest the fifth end surface 53a and the sixth end surface 53b, as do the first wavelength conversion rod 51 and the second wavelength conversion rod 52. The four side surfaces as a whole correspond to the fifth side surface in the appended claims. The third fluorescence KY3 exits out of the third wavelength conversion rod 53 via the fifth end surface 53a.

The third wavelength conversion rod 53 contains a ceramic phosphor (third phosphor) that converts in terms of wavelength third excitation light E3 into the third fluorescence KY3 having a third wavelength band. The third wavelength band is, for example, the yellow wavelength band ranging from 490 to 750 nm. That is, the third wavelength conversion rod 53 contains the same phosphor as those in the first wavelength conversion rod 51 and the second wavelength conversion rod 52 and outputs yellow third fluorescence KY3.

The first wavelength conversion rod 51 and the third wavelength conversion rod 53 are so disposed with a gap therebetween that the side surface 51c1 of the first wavelength conversion rod 51 faces the side surface 53c1 of the third wavelength conversion rod 53. The third wavelength conversion rod 53 and the second wavelength conversion rod 52 are so disposed with a gap therebetween that the side surface 53c2 of the third wavelength conversion rod 53 faces the side surface 52c1 of the second wavelength conversion rod 52. That is, the three wavelength conversion rods 51, 52, and 53 are disposed in parallel to one another.

The first end surface 51a (light exiting end surface) of the first wavelength conversion rod 51, the sixth end surface 53b of the third wavelength conversion rod 53, and the third end surface 52a (light exiting end surface) of the second wavelength conversion rod 52 are disposed at one-side ends of the wavelength conversion rods 51, 52, and 53 in the longitudinal direction thereof. The second end surface 51b of the first wavelength conversion rod 51, the fifth end surface 53a (light exiting end surface) of the third wavelength conversion rod 53, and the fourth end surface 52b of the second wavelength conversion rod 52 are disposed at the other-side ends of the wavelength conversion rods 51, 52, and 53 in the longitudinal direction thereof.

The light source 36 is provided in a position where the light source 36 faces one side surface of each of the wavelength conversion rods 51, 52, and 53. In addition to the light source 36, another light source may be further provided in a position where the light source faces another side surface of each of the wavelength conversion rods 51, 52, and 53.

The light source 36 includes a substrate 363 and a plurality of LEDs 61 mounted on one surface of the substrate 363 that is the surface facing the wavelength conversion rods 51, 52, and 53. In the present embodiment, 12 LEDs 61 are arranged in two rows each formed of 6 LEDs 61. The number of LEDs 61 is not limited to a specific number. The LEDs 61 each outputs excitation light having a predetermined wavelength band. The wavelength band of the excitation light is, for example, the ultraviolet wavelength band ranging from 200 to 380 nm. The wavelength band may, however, instead be, for example, the violet wavelength band somewhere around 400 nm or the blue wavelength band.

The plurality of LEDs 61 are each so provided as to face two of the wavelength conversion rods. That is, the LEDs 61 (first light emitter) on the right row in FIG. 4 are each so disposed as to spread on the first wavelength conversion rod 51 and the third wavelength conversion rod 53 and each serve as a light source for exciting the first wavelength conversion rod 51 and a light source for exciting the third wavelength conversion rod 53. The excitation light that enters the first wavelength conversion rod 51 and the excitation light that enters the third wavelength conversion rod 53 have the same wavelength band.

The LEDs 61 (second light emitter) in the left row in FIG. 4 are each so disposed as to spread on the second wavelength conversion rod 53 and the third wavelength conversion rod 53 and each serve as a light source for exciting the second wavelength conversion rod 52 and a light source for exciting the third wavelength conversion rod 53. The excitation light that enters the second wavelength conversion rod 53 and the excitation light that enters the third wavelength conversion rod 53 have the same wavelength band. The LEDs 61 in the two rows may output excitation light having the same wavelength band, or the LEDs 61 in one of the two rows may output excitation light having a wavelength band different from the wavelength band of the light outputted from the LEDs 61 in the other row. Out of the excitation light outputted from the LEDs 61, the excitation light that enters the first wavelength conversion rod 51 corresponds to the first excitation light E1, the excitation light that enters the second wavelength conversion rod 52 corresponds to the second excitation light E2, and the excitation light that enters the third wavelength conversion rod 53 corresponds to the third excitation light E3.

The light guide 42 includes a first prism mirror 43 (first light guide) and a second prism mirror 44 (second light guide). The first prism mirror 43 and the second prism mirror 44 are each formed of a triangular columnar prism having a right-angled isosceles triangular cross section.

The first prism mirror 43 has a first reflection surface 43f1, which faces the third end surface 52a of the second wavelength conversion rod 52, a third reflection surface 43f3, which faces the sixth end surface 53b of the third wavelength conversion rod 53, and a light incident/exiting surface 43ab. The second prism mirror 44 has a second reflection surface 44f2, which faces the second end surface 51b of the first wavelength conversion rod 51, a fourth reflection surface 44f4, which faces the fifth end surface 53a of the third wavelength conversion rod 53, and a light incident/exiting surface 44ab.

The other configurations of the light source apparatus 22 are the same as those in the first embodiment.

The behavior of the light in the light source apparatus 22 according to the present embodiment will be described below.

When the second excitation light E2 enters the second wavelength conversion rod 52, the second excitation light E2 excites the second phosphor contained in the second wavelength conversion rod 52, and the second fluorescence KY2 is emitted from the arbitrary light emission point P2. The second fluorescence KY2 travels omnidirectionally from the arbitrary light emission point P2, and the second fluorescence KY2 traveling toward the side surfaces travels toward the third end surface 52a or the fourth end surface 52b while being repeatedly totally reflected off the side surfaces. The second fluorescence KY2 traveling toward the third end surface 52a enters the first prism mirror 43. On the other hand, the second fluorescence KY2 traveling toward the fourth end surface 52b is reflected off the mirror 54, travels toward the third end surface 52a, and enters the first prism mirror 43.

The second fluorescence KY2 having entered the first prism mirror 43 is sequentially reflected off the first reflection surface 43f1 and the third reflection surface 43f3, so that the optical path of the second fluorescence KY2 is deflected back, and the second fluorescence KY2 enters the third wavelength conversion rod 53 via the sixth end surface 53b.

When the third excitation light E3 enters the third wavelength conversion rod 53, the third excitation light E3 excites the third phosphor contained in the third wavelength conversion rod 53, and the third fluorescence KY3 is emitted from an arbitrary light emission point P3. The third fluorescence KY3 travels omnidirectionally from the arbitrary light emission point P3, and the third fluorescence KY3 traveling toward the side surfaces travels toward the fifth end surface 53a or the sixth end surface 53b while being repeatedly totally reflected off the side surfaces. The third fluorescence KY3 traveling toward the fifth end surface 53a enters the second prism mirror 44. On the other hand, the third fluorescence KY3 traveling toward the sixth end surface 53b traces back the path of the second fluorescence KY2, enters the second wavelength conversion rod 52, is then reflected off the mirror 54 on the fourth end surface 52b, enters the third wavelength conversion rod 53 again, and travels toward the fifth end surface 53a.

The third fluorescence KY3 having entered the second prism mirror 44 is sequentially reflected off the fourth reflection surface 44f4 and the second reflection surface 44f2 of the second prism mirror 44, so that the optical path of the third fluorescence KY3 is deflected back, and the third fluorescence KY3 enters the first wavelength conversion rod 51 via the second end surface 51b. The second fluorescence KY2 also passes, along with the third fluorescence KY3, the third wavelength conversion rod 53 and enters the first wavelength conversion rod 51 via the second prism mirror 44.

When the first excitation light E1 enters the first wavelength conversion rod 51, the first excitation light E1 excites the first phosphor contained in the first wavelength conversion rod 51, and the first fluorescence KY1 is emitted from the arbitrary light emission point P1. The first fluorescence KY1 travels omnidirectionally from the arbitrary light emission point P1, and the first fluorescence KY1 traveling toward the side surfaces travels toward the first end surface 51a or the second end surface 51b while being repeatedly totally reflected off the side surfaces. The first fluorescence KY1 traveling toward the first end surface 51a enters the angle converter 56. The first fluorescence KY1 traveling toward the second end surface 51b traces back the path of the second fluorescence KY2, enters the second wavelength conversion rod 52, is reflected off the mirror 54 on the fourth end surface 52b, enters the first wavelength conversion rod 51 again via the third wavelength conversion rod 53, and travels toward the first end surface 51a.

The second fluorescence KY2 and the third fluorescence KY3 having entered the first wavelength conversion rod 51 travel along with the first fluorescence KY1 through the first wavelength conversion rod 51, and the yellow fluorescence KY formed of the first fluorescence KY1, the second fluorescence KY2, and the third fluorescence KY3 exits via the first end surface 51a of the first wavelength conversion rod 51. The fluorescence KY having exited out of the first wavelength conversion rod 51 is parallelized by the angular converter 56 and the collimator lens 57 and then outputted from the light source apparatus 2.

The second embodiment also provides the same effects as those provided by the first embodiment, for example, a compact light source apparatus 22 can be achieved, and a light source apparatus 22 having small etendue can be achieved.

In the present embodiment, in particular, in which the three wavelength conversion rods 51, 52, and 53, via which the fluorescence KY1, KY2, and KY3 exits, respectively, are so disposed that side surfaces thereof face each other, the dimension of the light source apparatus 22 in the longitudinal direction can be reduced to about one-third of the dimension in a case where the three wavelength conversion rods 51, 52, and 53 are so disposed that end surfaces thereof face each other.

Further, provided that the electric power supplied to the LEDs 61 is fixed, the light source apparatus 22 according to the present embodiment can produce high-intensity fluorescence KY with small etendue maintained, as compared with the intensity of the fluorescence KY produced by the light source apparatus according to the first embodiment. Provided that the intensity of the fluorescence KY is fixed in the present embodiment and the first embodiment, the light source apparatus 22 according to the present embodiment allows reduction in the electric power supplied to the LEDs 61 as compared with the supplied electric power in the light source apparatus according to the first embodiment.

According to the configuration in the present embodiment, the LEDs 61, which output excitation light, can be sparsely disposed with high excitation light coupling efficiency maintained. The LEDs 61 can therefore be readily cooled, whereby the efficiency of the light source 36 can be improved, and the size of a cooling system can be reduced.

Third Embodiment

A third embodiment of the present disclosure will be described below with reference to FIGS. 5 and 6.

The basic configuration of a projector according to the third embodiment is the same as that according to the first embodiment but differs from the first embodiment in that no blue light source section is provided. The overall configuration of the projector will not therefore be described.

The basic configuration of a light source apparatus according to the third embodiment is the same as that according to the first embodiment but differs from the first embodiment in terms of the configurations of the first wavelength conversion rod and the light source. The overall configuration of the light source apparatus will not therefore be described.

Figure 5:
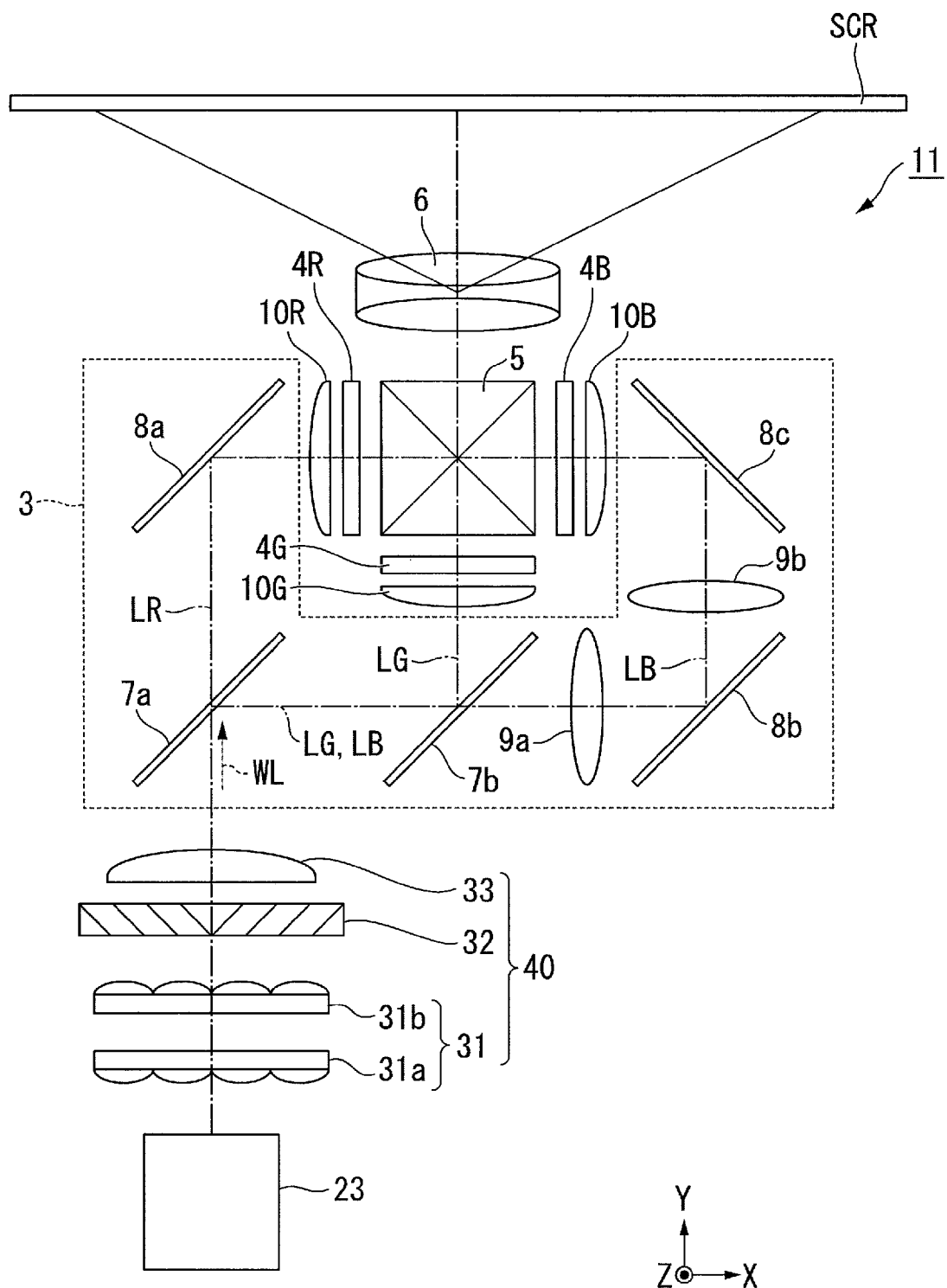
FIG. 5 is a schematic configuration diagram of a projector according to a third embodiment.

FIG. 5 is a schematic configuration diagram of a projector 11. FIG. 6 is a schematic configuration diagram of a light source apparatus 23.

Figure 6:
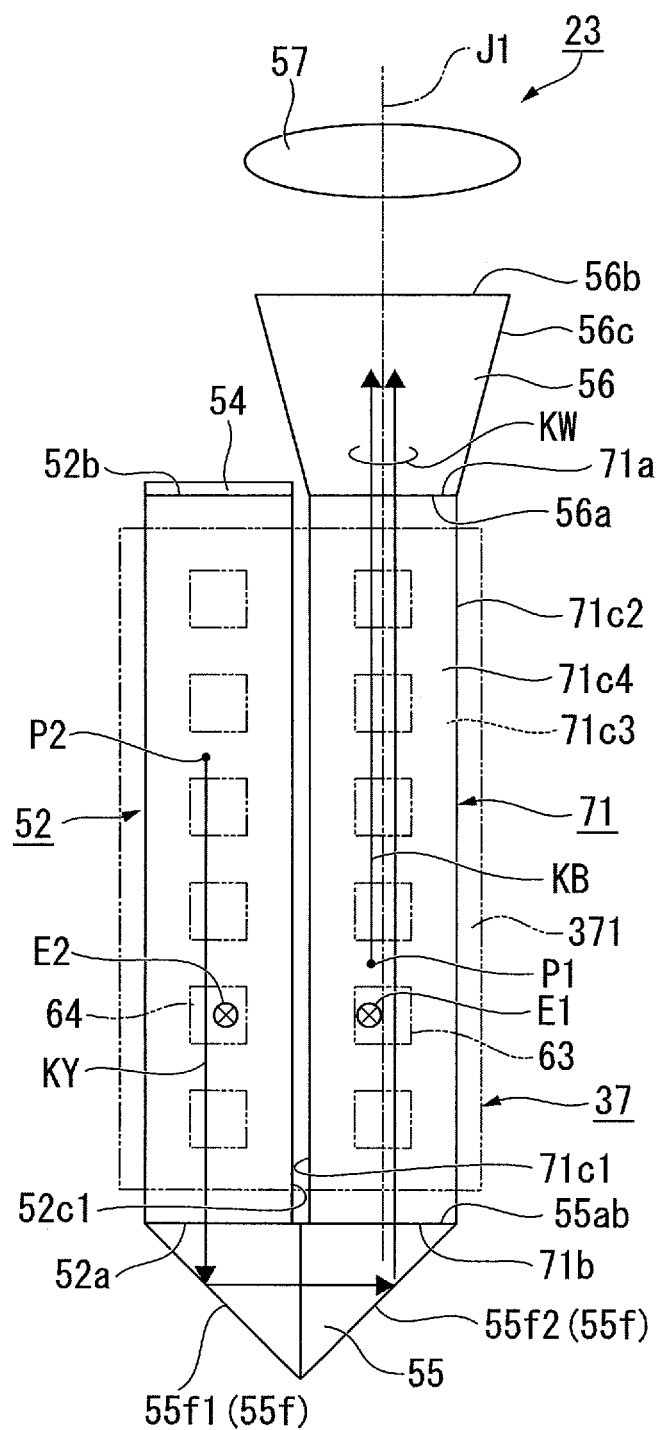
FIG. 6 is a schematic configuration diagram of a light source apparatus according to a third embodiment.

In FIGS. 5 and 6, components common to those in the first embodiment shown in FIGS. 1 and 2 have the same reference characters and will not be described.

The projector 11 includes the light source apparatus 23, the uniform illumination system 40, the color separation system 3, the light modulators 4R, 4G, and 4B, the light combining system 5, and the projection optical apparatus 6, as shown in FIG. 5. In the present embodiment, the light source apparatus 23 outputs white light.

The light source apparatus 23 according to the present embodiment includes a first wavelength conversion rod 71 (first wavelength converter), the second wavelength conversion rod 52 (second wavelength converter), a light source 37, the mirror 54 (reflector), the prism mirror 55 (light guide), the angle converter 56, and the collimator lens 57, as shown in FIG. 6.

The first wavelength conversion rod 71 has a quadrangular columnar shape and has a first end surface 71a and a second end surface 71b, which face each other, and four side surfaces 71c1, 71c2, 71c3, and 71c4, which interest the first end surface 71a and the second end surface 71b. The four side surfaces 71c1, 71c2, 71c3, and 71c4 as a whole correspond to the first side surface in the appended claims. Fluorescence KW exits out of the first wavelength conversion rod 71 via the first end surface 71a. The first wavelength conversion rod 71 may instead have a triangular columnar shape or any other polygonal columnar shape or a cylindrical shape, as in the first embodiment. The second wavelength conversion rod 52 is the same as that in the first embodiment.

The first wavelength conversion rod 71 and the second wavelength conversion rod 52 are so disposed with a gap therebetween that the side surface 71c1 of the first wavelength conversion rod 71 faces the side surface 52c1 of the second wavelength conversion rod 52. The first end surface 71a (light exiting end surface) of the first wavelength conversion rod 71 and the fourth end surface 52b of the second wavelength conversion rod 52 are disposed at one-side ends of the wavelength conversion rods 71 and 52 in the longitudinal direction thereof, and the second end surface 71b of the first wavelength conversion rod 71 and the third end surface 52a (light exiting end surface) of the second wavelength conversion rod 52 are disposed at the other-side ends of the wavelength conversion rods 71 and 52 in the longitudinal direction thereof.

The light source 37 is provided in a position where the light source 37 faces one side surface of each of the wavelength conversion rods 71 and 52. In addition to the light source 37, another light source may be further added in a position where the light source faces another side surface of each of the wavelength conversion rods 71 and 52.

The light source 37 includes a substrate 371 and a plurality of light emitting diodes 63 and 64 (LEDs) mounted on one surface of the substrate 371 that is the surface facing the wavelength conversion rods 71 and 52. In the present embodiment, the light source includes 12 LEDs 63 and 64 in total, which are arranged in two rows, one of the two rows formed of 6 LEDs 63 and the other row formed of 6 LEDs 64. The numbers of LEDs 63 and 64 are each not limited to a specific number.

The six LEDs 63 in the right row in FIG. 6 are arranged along the longitudinal direction of the first wavelength conversion rod 71. The six LEDs 64 in the left row are arranged along the longitudinal direction of the second wavelength conversion rod 52. In the following description, the LEDs 63 arranged along the longitudinal direction of the first wavelength conversion rod 71 are referred to as first LEDs 63 (first light emitter), and the LEDs 64 arranged along the longitudinal direction of the second wavelength conversion rod 52 are referred to as second LEDs 64 (second light emitter). The first LEDs 63 face a side surface of the first wavelength conversion rod 71, and the second LEDs 64 face a side surface of the second wavelength conversion rod 52.

The first excitation light E1 outputted from the first LEDs 63 enters the first wavelength conversion rod 71 and then functions as excitation light that excites the first phosphor contained in the first wavelength conversion rod 71. On the other hand, the second excitation light E2 outputted from the second LEDs 64 enters the second wavelength conversion rod 52 and then functions as excitation light that excites the second phosphor contained in the second wavelength conversion rod 52.

Therefore, the first LEDs 63 may output light having a wavelength band optimized for the first phosphor and the second LEDs 64 may output light having a wavelength band optimized for the second phosphor and different from the wavelength band of the light outputted from the first LEDs 63, or the first LEDs 63 and the second LEDs 64 may output light having the same wavelength band used commonly to the two phosphors. The wavelength bands of the first excitation light E1 and the second excitation light E2 are each, for example, the ultraviolet wavelength band ranging from 200 to 380 nm. The wavelength bands of the excitation light E1 and the excitation light E2 may each, however, instead be, for example, the violet wavelength band somewhere around 400 nm or the blue wavelength band.

The first wavelength conversion rod 71 is, for example, made of fluorescent glass that is glass in which a rare earth ion is dispersed or formed of a binder which is made, for example, of glass or resin and in which a blue phosphor is dispersed. Specifically, the fluorescent glass is, for example, LUMILASS (product name, manufactured by SUMITA OPTICAL GLASS, Inc.). The blue phosphor (first phosphor) is, for example, $BaMgAl_{10}O_{17}:Eu(II)$. The first wavelength conversion rod 71 converts the first excitation light E1 into first fluorescence KB (blue light) having a first wavelength band. The first wavelength band is, for example, a blue wavelength band ranging from 450 to 495 nm. The first fluorescence KB exits via the first end surface 71a of the first wavelength conversion rod 71.

The second wavelength conversion rod 52 is formed of a ceramic phosphor (second phosphor) that converts the second excitation light E2 into the second fluorescence KY having a second wavelength band, as in the first embodiment. The second wavelength band is, for example, the yellow wavelength band ranging from 490 to 750 nm. The second wavelength conversion rod 52 may be formed of a single-crystal phosphor or may instead be made of fluorescent glass or a glass or resin binder in which a large number of phosphor particles are dispersed. The second fluorescence KY exits via the third end surface 52a of the second wavelength conversion rod 52.

The other configurations of the light source apparatus 23 are the same as those in the first embodiment.

In the light source apparatus 23 according to the present embodiment, the first fluorescence KB is blue light, the second fluorescence KY is yellow light, which means that the first fluorescence KB and the second fluorescence KY differ from each other in color. Therefore, only the first fluorescence KB differs from the first fluorescence in the first embodiment in color, and the traveling paths of the fluorescence KB and KY are the same as those in the first embodiment. Out of the first fluorescence KB generated in the first wavelength conversion rod 71, the first fluorescence KB traveling toward the second end surface 71b enters the second wavelength conversion rod 52 via the prism mirror 55, and at least part of the first fluorescence KB having entered the second wavelength conversion rod 52 functions as excitation light that excites the second wavelength conversion rod 52.

The third embodiment also provides the same effects as those provided by the first embodiment, for example, a compact light source apparatus 23 can be achieved, and a light source apparatus 23 having small etendue can be achieved.

In the present embodiment, in particular, the first wavelength conversion rod 71 generates the blue first fluorescence KB, and the second wavelength conversion rod 52 generates the yellow second fluorescence KY. White fluorescence KW formed of the first fluorescence KB and the second fluorescence KY therefore exits via the first end surface 71a of the first wavelength conversion rod 71. It is therefore unnecessary to provide a blue light source section for producing white light separately from the light source apparatus 23, unlike in the first embodiment. The size of the illumination system of the projector 11 can thus be further reduced.

In the light source apparatus 23 according to the present embodiment, the amounts of the first fluorescence KB and the second fluorescence KY may be controlled by adjusting the electric power supplied to the first LEDs 63 and the second LEDs 64 to separately control the intensity of the first excitation light E1 and the intensity of the second excitation light E2. The white balance of the illumination light WL can thus be adjusted. The white balance may instead be adjusted in the design stage of the light source apparatus 23, for example, by creating a difference in length or width between the first wavelength conversion rod 71 and the second wavelength conversion rod 52 or in number between the first LEDs 63 and the second LEDs 64.

Fourth Embodiment

A fourth embodiment of the present disclosure will be described below with reference to FIG. 7.

A light source apparatus according to the fourth embodiment is the same as the light source apparatus according to the second embodiment in that three wavelength conversion rods are provided but differs therefrom in terms of the color of the fluorescence generated in each of the wavelength conversion rods and the configuration of the light source. The overall configuration of the light source apparatus will not therefore be described.

Figure 7:
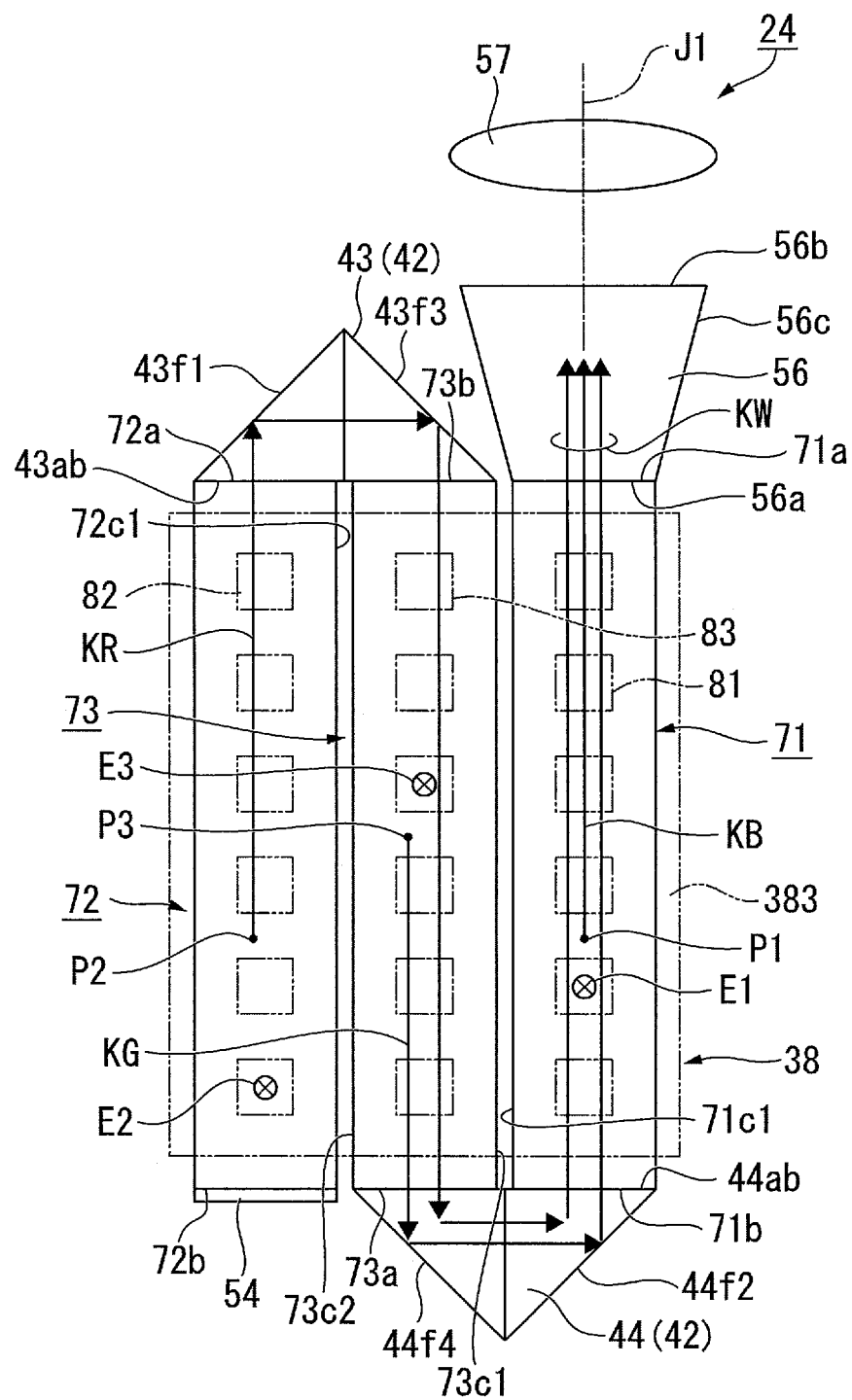
FIG. 7 is a schematic configuration diagram of a light source apparatus according to a fourth embodiment.

FIG. 7 is a schematic configuration diagram of a light source apparatus 24.

In FIG. 7, components common to those in the first embodiment shown in FIG. 2 and those in the second embodiment shown in FIG. 4 have the same reference characters and will not be described.

The light source apparatus 24 includes the first wavelength conversion rod 71 (first wavelength converter), a second wavelength conversion rod 72 (second wavelength converter), a third wavelength conversion rod 73 (third wavelength converter), a light source 38, the mirror 54 (reflector), the light guide 42, the angle converter 56, and the collimator lens 57, as shown in FIG. 7. The light guide 42 includes the first prism mirror 43 (first light guide) and the second prism mirror 44 (second light guide).

The first wavelength conversion rod 71 has the first end surface 71a and the second end surface 71b, which face each other, and the four side surfaces, which interest the first end surface 71a and the second end surface 71b. The second wavelength conversion rod 72 has a third end surface 72a and a fourth end surface 72b, which face each other, and four side surfaces that interest the third end surface 72a and the fourth end surface 72b. The third wavelength conversion rod 73 has a fifth end surface 73a and a sixth end surface 73b, which face each other, and four side surfaces that interest the fifth end surface 73a and the sixth end surface 73b.

The arrangement of the wavelength conversion rods 71, 72, and 73 is the same as the arrangement in the second embodiment. That is, the first wavelength conversion rod 71 and the third wavelength conversion rod 73 are so disposed with a gap therebetween that the side surface 71c1 of the first wavelength conversion rod 71 faces a side surface 73c1 of the third wavelength conversion rod 73. The third wavelength conversion rod 73 and the second wavelength conversion rod 72 are so disposed with a gap therebetween that a side surface 73c2 of the third wavelength conversion rod 73 faces a side surface 72c1 of the second wavelength conversion rod 72. That is, the three wavelength conversion rods 71, 72, and 73 are disposed in parallel to one another.

The light source 38 is provided in a position where the light source 38 faces one side surface of each of the wavelength conversion rods 71, 72, and 73. In addition to the light source 38, another light source may be further added in a position where the light source faces another side surface of each of the wavelength conversion rods 71, 72, and 73.

The light source 38 includes a substrate 383 and a plurality of LEDs 81, 82, and 83 mounted on one surface of the substrate 383 that is the surface facing the first wavelength conversion rods 71, the second wavelength conversion rods 72, and the third wavelength conversion rods 73. In the present embodiment, the light source 38 includes 18 LEDs 81, 82, and 83 in total, but the numbers of LEDs 81, 82, and 83 are not each limited to a specific number. The LEDs 81, 82, and 83 output the first excitation light E1, the second excitation light E2, and the third excitation light E3, respectively.

The plurality of LEDs 81, 82, and 83 are so provided as to face a side surface of the first wavelength conversion rod 71, a side surface of the second wavelength conversion rod 72, and a side surface of the third wavelength conversion rod 73, respectively. The plurality of LEDs 81, 82, and 83 are arranged in three rows each formed of 6 LEDs. The LEDs 81, which form part of the plurality of LEDs, are arranged along the longitudinal direction of the first wavelength conversion rod 71, the LEDs 82, which form another part of the plurality of LEDs, are arranged along the longitudinal direction of the second wavelength conversion rod 72, and the LEDs 83, which form still another part of the plurality of LEDs, are arranged along the longitudinal direction of the third wavelength conversion rod 73. In the following description, the LEDs arranged along the longitudinal direction of the first wavelength conversion rod 71 are called first LEDs 81 (first light emitter), the LEDs arranged along the longitudinal direction of the second wavelength conversion rod 72 are called second LEDs 82 (second light emitter), and the LEDs arranged along the longitudinal direction of the third wavelength conversion rod 73 are called third LEDs 83.

The first LEDs 81 output the first excitation light E1, which excites the first phosphor contained in the first wavelength conversion rod 71. The second LEDs 82 output the second excitation light E2, which excites the second phosphor contained in the second wavelength conversion rod 72. The third LEDs 83 output the third excitation light E3, which excites the third phosphor contained in the third wavelength conversion rod 73. The first excitation light E1, the second excitation light E2, and the third excitation light E3 differ from one another in terms of phosphor to be excited. Therefore, the first LEDs 81 may output light having a wavelength band optimized for the phosphor in the first wavelength conversion rod 71, the second LEDs 82 may output light having a wavelength band optimized for the phosphor in the second wavelength conversion rod 72 and different from the wavelength band of the light outputted from the first LEDs 81, and the third LEDs 83 may output light having a wavelength band optimized for the phosphor in the third wavelength conversion rod 73 and different from the wavelength bands of the light outputted from the first LEDs 81 and the second LEDS 82, or the first LEDs 81, the second LEDs 82, and the third LEDs 83 may output light having the same wavelength band used commonly to the three phosphors.

In the present embodiment, the first LEDs 81 are so provided as to face a side surface of the first wavelength conversion rod 71 and output the first excitation light E1 toward the side surface. The wavelength band of the first excitation light E1 is, for example, the ultraviolet wavelength band ranging from 200 to 380 nm. The wavelength band may, however, instead be, for example, the violet wavelength band somewhere around 400 nm.

The second LEDs 82 are so provided as to face a side surface of the second wavelength conversion rod 72 and output the second excitation light E2 toward the side surface. The wavelength band of the second excitation light E2 is, for example, the blue wavelength band ranging from 450 to 495 nm. The wavelength band may, however, instead be, for example, the ultraviolet wavelength band ranging from 200 to 380 nm or the violet wavelength band somewhere around 400 nm.

The third LEDs 83 are so provided as to face a side surface of the third wavelength conversion rod 73 and output the third excitation light E3 toward the side surface. The wavelength band of the third excitation light E3 is, for example, the blue wavelength band ranging from 450 to 495 nm. The wavelength band may, however, instead be, for example, the ultraviolet wavelength band ranging from 200 to 380 nm or the violet wavelength band somewhere around 400 nm.

The first wavelength conversion rod 71 converts the first excitation light E1 into the first fluorescence KB (blue light) having the first wavelength band. The first wavelength band is, for example, the blue wavelength band ranging from 450 to 495 nm. The first wavelength conversion rod 71 is, for example, made of fluorescent glass that is glass in which a rare earth ion is dispersed or formed of a binder which is made, for example, of glass or resin and in which a blue phosphor is dispersed. Specifically, the fluorescent glass is, for example, LUMILASS (product name, manufactured by SUMITA OPTICAL GLASS, Inc.). The blue phosphor (first phosphor) is, for example, $BaMgAl_{10}O_{17}:Eu(II)$.

The second wavelength conversion rod 72 converts the second excitation light E2 into second fluorescence KR (red light) having a second wavelength band. The second wavelength band is, for example, a red wavelength band ranging from 600 to 800 nm. The second wavelength conversion rod 72 contains, as a red phosphor (second phosphor), a YAG-based phosphor made, for example, of $(Y_{1-x}Gd_x)_3$ $(Al, Ga)_5O_{12}$ in which any of Pr, Eu, and Cr is dispersed as an activator (any of Pr:YAG, Eu:YAG, and Cr:YAG). The activator may be one type selected from Pr, Eu, and Cr or may be a co-activator containing a plurality of types selected from Pr, Eu, and Cr.

The third wavelength conversion rod 73 converts the third excitation light E3 into third fluorescence KG (green light) having a third wavelength band. The third wavelength band is, for example, a green wavelength band ranging from 500 to 570 nm. The third wavelength conversion rod 73 contains, as a green phosphor (third phosphor), for example, an $Lu_3Al_5O_{12}:Ce^{3+}$-based phosphor, a $Y_3O_4:Eu^{2+}$-based phosphor, a $(Ba, Sr)_2SiO_4:Eu^{2-}$-based phosphor, $Ba_3Si_6O_{12}N_2:Eu^{2+}$-based phosphor, an $(Si, Al)_6(O, N)_8:Eu^{2|}$-based phosphor, or any other phosphor material.

The other configurations of the light source apparatus 24 are the same as those in the second embodiment.

In the light source apparatus 24 according to the present embodiment, the first wavelength band of the first fluorescence KB is a blue wavelength band, the second wavelength band of the second fluorescence KR is a red wavelength band, and the third wavelength band of the third fluorescence KG is a green wavelength band. The first fluorescence KB, the second fluorescence KR, and the third fluorescence KG thus differ from one another in color. The present embodiment differs from the second embodiment only in terms of the colors of the fluorescence KB, KR, and KG and is the same as the second embodiment in terms of the traveling paths of the fluorescence KB, KR, and KG.

The fourth embodiment also provides the same effects as those provided by the first embodiment, for example, a compact light source apparatus 24 can be achieved, and a light source apparatus 24 having small etendue can be achieved. The fourth embodiment further provides the same effects as those provided by the third embodiment, for example, it is unnecessary to provide a blue light source section separately from the light source apparatus 24, and the size of the illumination system can be further reduced.

In the light source apparatus 24 according to the present embodiment, the amounts of the first fluorescence KB, the second fluorescence KR, and the third fluorescence KG may be controlled by adjusting the electric power supplied to the first LEDs 81, the second LEDs 82, and the third LEDs 83 to separately control the intensity of the first excitation light E1, the intensity of the second excitation light E2, and the intensity of the third excitation light E3. The white balance of the illumination light WL can thus be adjusted. The white balance may instead be adjusted in the design stage of the light source apparatus 24, for example, by creating a difference in length or width among the first wavelength conversion rod 71, the second wavelength conversion rod 72, and the third wavelength conversion rod 73 or in number among the first LEDs 81, the second LEDs 82, and the third LEDs 83.

In the present embodiment, the second fluorescence KR (red light) generated in the second wavelength conversion rod 72 enters the third wavelength conversion rod 73, the third fluorescence KG (green light) generated in the third wavelength conversion rod 73 enters, along with the second fluorescence, the first wavelength conversion rod 71, and the first fluorescence KB (blue light) generated in the first wavelength conversion rod 71 exits, along with the third fluorescence KG (green light) and the second fluorescence KR (red light), out of the first wavelength conversion rod 71. As described above, since fluorescence having a relatively long wavelength enters a wavelength conversion rod that generates fluorescence having a relatively short wavelength, the fluorescence generated in one wavelength conversion rod is not consumed as excitation light when the fluorescence enters the following wavelength conversion rod. As a result, the light source apparatus 24 according to the present embodiment allows the white balance to be maintained.

The technical range of the present disclosure is not limited to the embodiments described above, and a variety of changes can be made thereto to the extent that the changes do not depart from the substance of the present disclosure.

For example, the light guides shown below may each replace the light guide in each of the embodiments described above.

Figure 8:
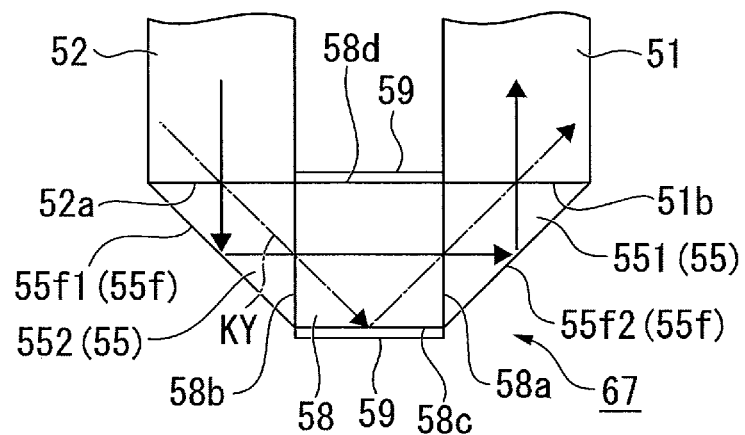
FIG. 8 is a schematic configuration diagram of a light guide according to a first variation.

FIG. 8 is a schematic configuration diagram of a light guide according to a first variation.

A light guide 67 according to the first variation includes the prism mirror 55 and a glass block 58, as shown in FIG. 8. Specifically, the light guide 67 includes a first prism 551, which has a triangular columnar shape and has the first reflection surface 55f1, a second prism 552, which has a triangular columnar shape and has the second reflection surface 55f2, and the glass block 58, which has a quadrangular columnar shape. The glass block 58 is provided between the first prism 551 and the second prism 552.

Out of the plurality of surfaces of the glass block 58, a first surface 58a is in contact with the first prism 551, and a second surface 58b, which faces the first surface 58a, is in contact with the second prism 552. A reflection film 59 is provided on each of a third surface 58c and a fourth surface 58d, which intersect the first surface 58a and the second surface 58b. That is, the glass block 58 has the function of guiding light therein.

Figure 9:
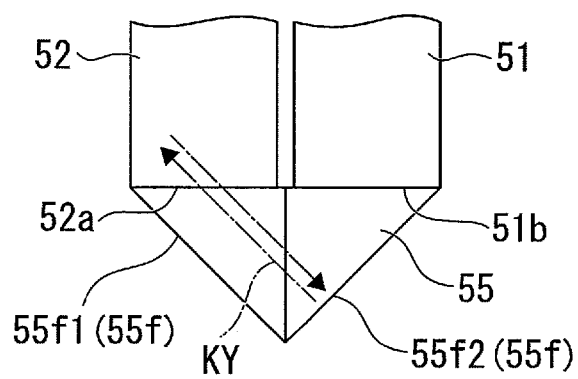
FIG. 9 describes a problem of a light guide in the first embodiment.

FIG. 9 describes a problem of the light guide in the first embodiment.

In the prism mirror 55 in the first embodiment, the fluorescence KY having exited via the third end surface 52a of the second wavelength conversion rod 52 at an exiting angle of 45° is incident on the second reflection surface 55f2 at right angles. Therefore, the fluorescence KY is reflected off the second reflection surface 55f2, and the optical path of the fluorescence KY is deflected in the direction opposite the direction in which the fluorescence KY is incident on the second reflection surface 55f2. The fluorescence KY therefore undesirably returns to the second wavelength conversion rod 52. The fluorescence KY that returns to the second wavelength conversion rod 52 therefore causes loss, resulting in a decrease in light use efficiency.

In contrast, in the light guide 67 according to the first variation, the fluorescence KY having exited via the third end surface 52a of the second wavelength conversion rod 52 at the exiting angle of 45° is incident on the third surface 58c of the glass block 58 at an angle of incidence of 45°. The fluorescence KY is then reflected off the reflection film 59 and enters the first wavelength conversion rod 51 via the second end surface 51b. As described above, the light guide 67 according to the first variation allows the fluorescence KY having exited at the angle described above to be unlikely to return to the second wavelength conversion rod 52 but likely to enter the first wavelength conversion rod 51, increasing the light use efficiency.

Figure 10:
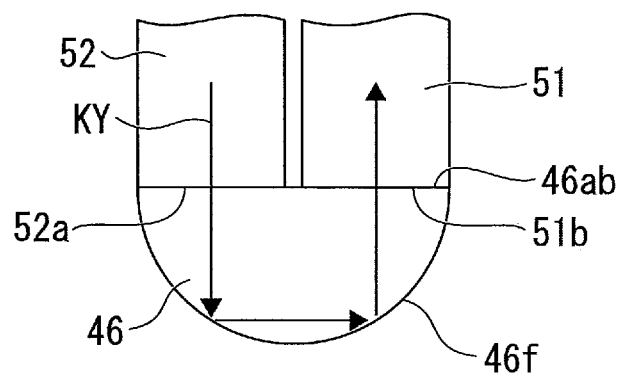
FIG. 10 is a schematic configuration diagram of a light guide according to a second variation.

FIG. 10 is a schematic configuration diagram of a light guide 46 according to a second variation.

The light guide 46 according to the second variation is formed of a light guide so shaped that a cylinder is halved by a plane including the center axis of the cylinder shown in FIG. 10. A light incident/exiting end surface 46ab of the light guide 46 faces the third end surface 52a of the second wavelength conversion rod 52 and the second end surface 51b of the first wavelength conversion rod 51. A reflection surface 46f of the light guide 46 reflects the second fluorescence KY having exited out of the second wavelength conversion rod 52. That is, the reflection surface 46f of the light guide 46 according to the variation is so provided as to face the third end surface 52b of the second wavelength conversion rod 52 and the second end surface 51b of the first wavelength conversion rod 51. Even the thus configured light guide 46 can guide the second fluorescence KY having exited out of the second wavelength conversion rod 52 to the first wavelength conversion rod 51.

The above embodiments have been described with reference to the case where the second wavelength conversion rod contains a phosphor that emits yellow fluorescence. The second wavelength conversion rod may instead contain two types of phosphor formed of a phosphor that emits green fluorescence and a phosphor that emits red fluorescence. In this case, the two types of phosphor may be uniformly mixed with each other in the second wavelength conversion rod or may be individually present in separate regions of the second wavelength conversion rod.

In the third embodiment, in which the wavelength conversion rods differ from one another in color of fluorescence generated therein, the first wavelength band of the first fluorescence may be a green wavelength band, and the second wavelength band of the second fluorescence may be a red wavelength band. The configuration described above allows a light source apparatus capable of producing yellow fluorescence to be achieved. The configuration is therefore applicable to the illuminator of the projector according to the first embodiment, which produces white light in cooperation with the blue light source section.

In each of the embodiments described above, a dichroic mirror that reflects the first excitation light and transmits the first fluorescence and the second fluorescence may be provided on the first end surface of the first wavelength conversion rod. Further, a dichroic mirror that reflects the second excitation light and transmits the second fluorescence may be provided on the third end surface of the second wavelength conversion rod. In the fourth embodiment, a dichroic mirror that reflects the third excitation light and transmits the third fluorescence may be provided on the fifth end surface of the third wavelength conversion rod. According to the configurations described above, the wavelength conversion efficiency of each of the wavelength conversion rods can be increased. Moreover, a dichroic mirror that transmits the excitation light and reflects the fluorescence may be provided at each side surface of each of the wavelength conversion rods.

The shape, the number, the arrangement, the material, and other specific configurations of the components that form the light source apparatuses are not limited to those in the embodiments described above and can be changed as appropriate.

The above embodiments have been described with reference to the case where the present disclosure is applied to a transmissive liquid crystal projector, and the present disclosure is also applicable to a reflective liquid crystal projector. The term "transmissive" used herein means that a liquid crystal light valve, including a liquid crystal panel or any other component, transmits light. The term "reflective" means that the liquid crystal light valve reflects light.

The above embodiments have been described with reference to a projector including three liquid crystal panels. The present disclosure is also applicable to a projector using only one liquid crystal light valve and a projector using four or more liquid crystal light valves.

The above embodiments have been described with reference to the case where the light source apparatus according to each of the embodiments of the present disclosure is incorporated in a projector, but not necessarily. The light source apparatus according to each of the embodiments of the present disclosure may also be used as a lighting apparatus, a headlight of an automobile, and other components.

What is claimed is:

1. A light source apparatus comprising:
a light source that outputs excitation light;
a first wavelength converter that contains a first phosphor and converts the excitation light into first fluorescence having a first wavelength band different from a wavelength band of the excitation light;
a second wavelength converter that contains a second phosphor and converts the excitation light into second fluorescence having a second wavelength band different from the wavelength band of the excitation light; and
a light guide that guides the second fluorescence having exited out of the second wavelength converter to the first wavelength converter,
wherein the first wavelength converter has a first end surface and a second end surface that face each other and a first side surface that intersects the first and second end surfaces,
the second wavelength converter has a third end surface and a fourth end surface that face each other and a second side surface that intersects the third and fourth end surfaces,
the first side surface of the first wavelength converter faces the second side surface of the second wavelength converter,
the light guide has a reflection surface that faces the third end surface of the second wavelength converter and the second end surface of the first wavelength converter, and
the first fluorescence and the second fluorescence exit via the first end surface of the first wavelength converter,
the reflection surface of the light guide has a first reflection surface facing the third end surface of the second wavelength converter and a second reflection surface facing the second end surface of the first wavelength converter,
the second fluorescence generated in the second wavelength converter exists via the third end surface, is reflected off the first reflection surface, is reflected off the second reflection surface, enters the first wavelength converter via the second end surface, and exits via the first end surface, and
the light guide includes
a first prism having the first reflection surface,
a second prism having the second reflection surface, and
a glass block provided between the first prism and the second prism.

2. The light source apparatus according to claim 1, further comprising a reflector that is provided at the fourth end surface of the second wavelength converter and reflects the second fluorescence guided in the second wavelength converter.

3. The light source apparatus according to claim 1,
further comprising a third wavelength converter that contains a third phosphor and outputs third fluorescence having a third wavelength band different from the first and second wavelength bands,
the third wavelength converter has a fifth end surface and a sixth end surface that face each other and a fifth side surface that intersects the fifth and sixth end surfaces,
the first side surface of the first wavelength converter faces the fifth side surface of the third wavelength converter,
the second side surface of the second wavelength converter faces the fifth side surface of the third wavelength converter,
the light guide includes
a first light guide having the first reflection surface and a third reflection surface that faces the sixth end surface of the third wavelength converter, and
a second light guide having the second reflection surface and a fourth reflection surface that faces the fifth end surface of the third wavelength converter.

4. The light source apparatus according to claim 3, wherein the first wavelength band is a blue wavelength band, the second wavelength band is a red wavelength band, and the third wavelength band is a green wavelength band.

5. The light source apparatus according to claim 1, wherein the light source includes a first light emitter that outputs first excitation light and a second light emitter that outputs second excitation light.

6. The light source apparatus according to claim 5,
wherein the first wavelength converter has a third side surface that intersects the first and second end surfaces,
the second wavelength converter has a fourth side surface that intersects the third and fourth end surfaces,
the first excitation light enters the first wavelength converter via the third side surface of the first wavelength converter, and
the second excitation light enters the second wavelength converter via the fourth side surface of the second wavelength converter.

7. The light source apparatus according to claim 5, wherein the light source includes a light emitting diode that is so provided as to face the third side surface of the first wavelength converter and the fourth side surface of the second wavelength converter and outputs the first excitation light and the second excitation light.

8. The light source apparatus according to claim 5, wherein the first excitation light and the second excitation light differ from each other in terms of wavelength band.

9. The light source apparatus according to claim 1, wherein the first wavelength band is equal to the second wavelength band.

10. The light source apparatus according to claim 1, wherein the first wavelength band differs from the second wavelength band.

11. The light source apparatus according to claim 10, wherein the first wavelength band is a blue wavelength band, and the second wavelength band is a yellow wavelength band.

12. The light source apparatus according to claim 10, wherein the first wavelength band is a green wavelength band, and the second wavelength band is a red wavelength band.

13. The light source apparatus according to claim 1, further comprising an angle converter that is provided at a light exiting side of the first wavelength converter, has a light incident end surface and a light exiting end surface, and causes a diffusion angle of the combined fluorescence at the light exiting end surface to be smaller than the diffusion angle of the combined fluorescence at the light incident end surface.

14. A projector comprising:
the light source apparatus according to claim 1;
a light modulator that modulates light from the light source apparatus in accordance with image information; and
a projection optical apparatus that projects the light modulated by the light modulator.

15. A light source apparatus comprising:
a light source that outputs excitation light;
a first wavelength converter that contains a first phosphor and converts the excitation light into first fluorescence having a first wavelength band different from a wavelength band of the excitation light;
a second wavelength converter that contains a second phosphor and converts the excitation light into second fluorescence having a second wavelength band different from the wavelength band of the excitation light; and
a light guide that guides the second fluorescence having exited out of the second wavelength converter to the first wavelength converter,
wherein the first wavelength converter has a first end surface and a second end surface that face each other and a first side surface that intersects the first and second end surfaces,
the second wavelength converter has a third end surface and a fourth end surface that face each other and a second side surface that intersects the third and fourth end surfaces,
the first side surface of the first wavelength converter faces the second side surface of the second wavelength converter,
the light guide has a reflection surface that faces the third end surface of the second wavelength converter and the second end surface of the first wavelength converter,
the first fluorescence and the second fluorescence exit via the first end surface of the first wavelength converter,
the light source includes a first light emitter that outputs first excitation light and a second light emitter that outputs second excitation light, and
the first excitation light and the second excitation light differ from each other in terms of wavelength band.

16. A light source apparatus comprising:
a light source that outputs excitation light;
a first wavelength converter that contains a first phosphor and converts the excitation light into first fluorescence having a first wavelength band different from a wavelength band of the excitation light;
a second wavelength converter that contains a second phosphor and converts the excitation light into second fluorescence having a second wavelength band different from the wavelength band of the excitation light; and
a light guide that guides the second fluorescence having exited out of the second wavelength converter to the first wavelength converter,
wherein the first wavelength converter has a first end surface and a second end surface that face each other and a first side surface that intersects the first and second end surfaces,
the second wavelength converter has a third end surface and a fourth end surface that face each other and a second side surface that intersects the third and fourth end surfaces,
the first side surface of the first wavelength converter faces the second side surface of the second wavelength converter,
the light guide has a reflection surface that faces the third end surface of the second wavelength converter and the second end surface of the first wavelength converter,
the first fluorescence and the second fluorescence exit via the first end surface of the first wavelength converter, and
the first wavelength band is equal to the second wavelength band.

17. A light source apparatus comprising:
a light source that outputs excitation light;
a first wavelength converter that contains a first phosphor and converts the excitation light into first fluorescence having a first wavelength band different from a wavelength band of the excitation light;
a second wavelength converter that contains a second phosphor and converts the excitation light into second fluorescence having a second wavelength band different from the wavelength band of the excitation light; and
a light guide that guides the second fluorescence having exited out of the second wavelength converter to the first wavelength converter,
wherein the first wavelength converter has a first end surface and a second end surface that face each other and a first side surface that intersects the first and second end surfaces,
the second wavelength converter has a third end surface and a fourth end surface that face each other and a second side surface that intersects the third and fourth end surfaces,
the first side surface of the first wavelength converter faces the second side surface of the second wavelength converter,
the light guide has a reflection surface that faces the third end surface of the second wavelength converter and the second end surface of the first wavelength converter,
the first fluorescence and the second fluorescence exit via the first end surface of the first wavelength converter,
the first wavelength band differs from the second wavelength band, and the first wavelength band is a blue wavelength band, and the second wavelength band is a yellow wavelength band.

18. A light source apparatus comprising:

a light source that outputs excitation light;

a first wavelength converter that contains a first phosphor and converts the excitation light into first fluorescence having a first wavelength band different from a wavelength band of the excitation light;

a second wavelength converter that contains a second phosphor and converts the excitation light into second fluorescence having a second wavelength band different from the wavelength band of the excitation light; and a light guide that guides the second fluorescence having exited out of the second wavelength converter to the first wavelength converter, wherein the first wavelength converter has a first end surface and a second end surface that face each other and a first side surface that intersects the first and second end surfaces, the second wavelength converter has a third end surface and a fourth end surface that face each other and a second side surface that intersects the third and fourth end surfaces, the first side surface of the first wavelength converter faces the second side surface of the second wavelength converter, the light guide has a reflection surface that faces the third end surface of the second wavelength converter and the second end surface of the first wavelength converter, the first fluorescence and the second fluorescence exit via the first end surface of the first wavelength converter, the first wavelength band differs from the second wavelength band, and the first wavelength band is a green wavelength band, and the second wavelength band is a red wavelength band.

* * * * *